United States Patent [19]
Ugajin

[11] Patent Number: 5,831,294
[45] Date of Patent: Nov. 3, 1998

[54] QUANTUM BOX STRUCTURE AND CARRIER CONDUCTIVITY MODULATING DEVICE

[75] Inventor: Ryuichi Ugajin, Kanagawa, Japan

[73] Assignee: Sony Corporation, Tokyo, Japan

[21] Appl. No.: 784,411

[22] Filed: Jan. 16, 1997

Related U.S. Application Data

[63] Continuation of Ser. No. 369,659, Jan. 6, 1995, abandoned.

[30] Foreign Application Priority Data

| Jan. 7, 1994 | [JP] | Japan | 6-012092 |
| Mar. 22, 1994 | [JP] | Japan | 6-075338 |
| Mar. 25, 1994 | [JP] | Japan | 6-079725 |

[51] Int. Cl.$^6$ .................. H01L 31/0328; H01L 31/0336; H01L 31/072; H01L 35/26
[52] U.S. Cl. .............................. 257/191; 257/23; 257/25; 257/196
[58] Field of Search .................. 257/191, 183, 257/196, 185, 23, 25

[56] References Cited

U.S. PATENT DOCUMENTS

| 4,912,531 | 3/1990 | Reed et al. . | |
| 4,942,437 | 7/1990 | Fowler et al. . | |
| 5,119,151 | 6/1992 | Onda . | |
| 5,233,205 | 8/1993 | Usagawa et al. | 257/23 |
| 5,313,484 | 5/1994 | Arimoto | 372/46 |
| 5,332,681 | 7/1994 | Tonucci et al. | 437/16 |
| 5,447,873 | 9/1995 | Randall et al. | 437/40 |
| 5,459,334 | 10/1995 | Dutta et al. | 257/26 |

*Primary Examiner*—Ngân V. Ngô
*Attorney, Agent, or Firm*—Hill & Simpson

[57] ABSTRACT

A quantum box structure and a carrier conductivity modulating quantum device are disclosed. The quantum box structure comprises a quantum boxes array including a plurality of quantum boxes arranged adjacent to each other on a common plane. Each quantum box is asymmetric in a direction orthogonal to the plane in one of composition of materials constituting the quantum box and geometry of the quantum box. The carrier conductivity modulating quantum device comprises a plurality of regions including quantum boxes arrays including a plurality of quantum boxes arranged on a common plane. Each regions exhibits at least one of a metal phase and an insulator phase. Each quantum box is asymmetric in a direction orthogonal to the plane at least in one of composition of materials constituting the quantum box and geometry of the quantum box.

9 Claims, 23 Drawing Sheets

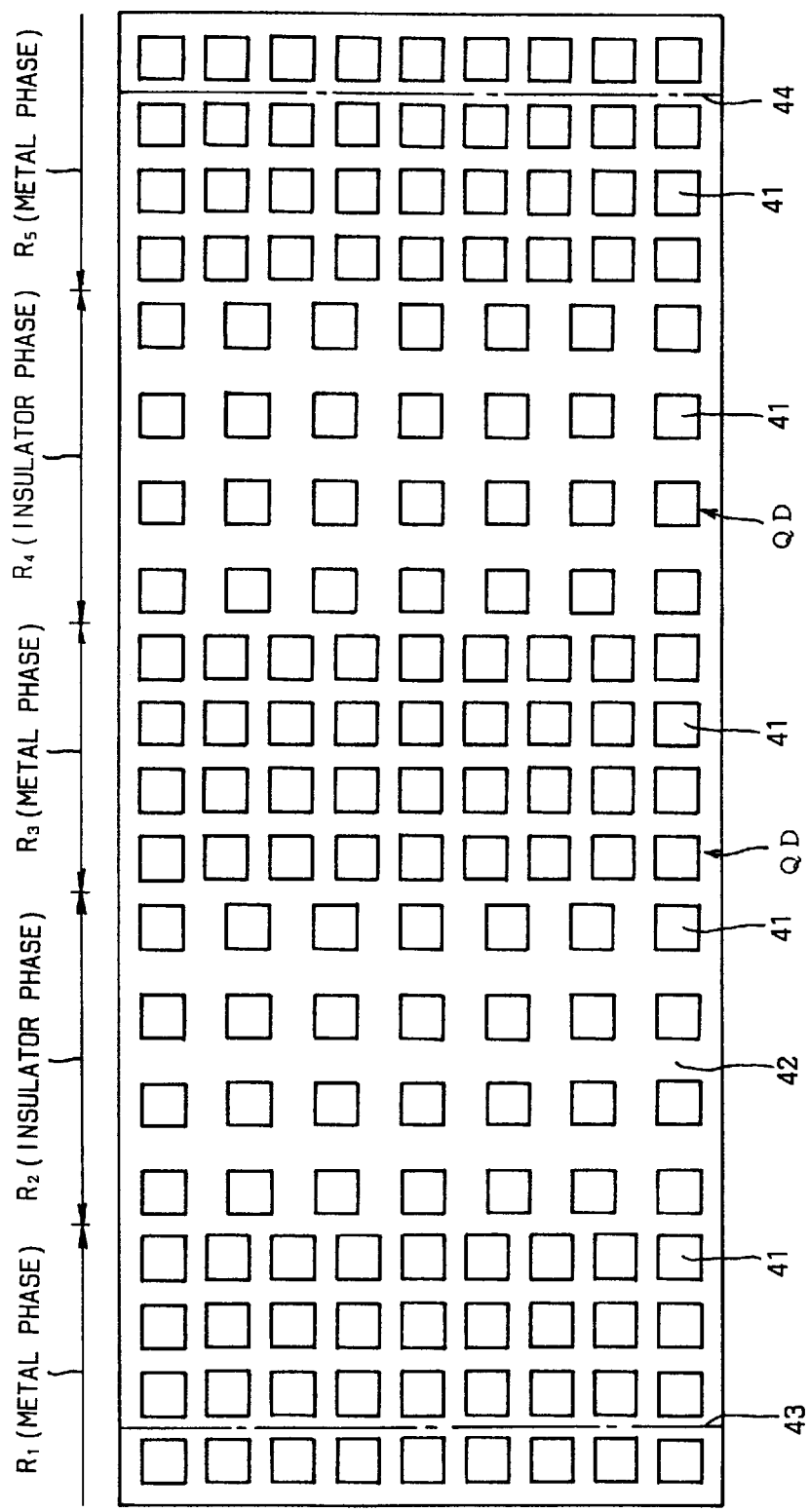

QUANTUM BOX STRUCTURE AND CARRIER CONDUCTIVITY MODULATING DEVICE

This is a continuation, of application Ser. No. 08/369,659 filed Jan. 6, 1995, now abandoned.

BACKGROUND OF THE INVENTION

1. Field of the Invention

This invention relates to a quantum box structure and a carrier conductivity modulating device and, more particularly, to a carrier conductivity modulating quantum device using quantum boxes (also called quantum dots).

2. Description of the Related Arts

As future prospects for semiconductor devices, the use of interactions among electrons is under consideration. For one reason, improvements in quality of semiconductor crystals have made it possible to realize low density of electric charges with uniformity. For another reason, hetero junctions of compound semiconductors have made it possible to confine electric charges in a narrow region. From this viewpoint, coupled quantum dots arrays have attracted special interest recently.

The present Applicant formerly proposed, in Japanese Patent Application No. Hei 5-21982, a method for modulating movements of electrons among quantum dots in such a coupled quantum dots array by an external electric field, and further proposed, in Japanese Patent Application No. Hei 5-174774, an assembled quantum dots device using this method.

In these methods, however, correlative modulation of electrons in the quantum dots array by the external electric field was not satisfactory efficient.

On the other hand, there is recent vigorous study o n semiconductor devices using a quantum-mechanical tunnelling effect. Typical examples include resonant tunneling diodes using GaAs/AlGaAs hetero junctions, resonant tunnelling type hot electron transistors (RHET) using GaAs/AlGaAs heterojunctions, and others.

In conventional semiconductor devices using the quantum-mechanical tunnelling effect, the barrier height and the barrier width greatly affect the tunnelling effect, and therefore require precise control. This requirement causes a difficulty in manufacturing conventional semiconductor devices using the quantum-mechanical tunnelling effect and in integrating the semiconductor devices.

OBJECTS AND SUMMARY OF THE INVENTION

It is, therefore, an object of the present invention to provide a quantum device capable of efficiently modulating correlation among electrons or holes in a quantum boxes array by applying an external electric field.

Another object of the invention is to provide a quantum device capable of effectively modulating a current from one end to the other end of a quantum boxes array by an external electric field.

Still another object of the invention is to provide a quantum device employing a many-body quantum-mechanical tunnelling effect based on a new theory and hence is easier for fabrication and integration than a semiconductor device using a conventional quantum-mechanical tunneling effect.

Yet another object of the invention is to provide a quantum device capable of controlling the presence or absence of a tunnelling barrier by an external electric field.

Yet another object of the invention is to provide a quantum device capable of interchanging a tunneling barrier region and a conduction region by an external electric field.

According to an aspect of the invention, there is provided a quantum box structure comprising a plurality of quantum boxes arranged adjacent to each other on a common plane, each quantum box being asymmetric in a direction orthogonal to the plane at least in one of composition of materials constituting the quantum box and geometry of the quantum box.

According to another aspect of the invention, there is provided a carrier conductivity modulating quantum device comprising a plurality of regions including a plurality of quantum boxes arranged on a common plane, each region exhibiting at least one of a metal phase and an insulator phase.

The physical meaning of "transfer energy" used in the following description will now be explained below.

Consideration is made below of a coupled quantum boxes system comprising a quantum box 1 with center coordinates $(r_x, r_y)$ and a quantum box 2 with center coordinates $(-r_x, -r_y)$. Then, dynamics of electrons in the coupled quantum boxes system are discussed on the basis of the LCAO (Linear Combination of Atomic Orbitals) approximation known as an effective approximation method for analyzing the electronic state of a hydrogen molecule ion $(H_2^+)$ from an exact solution of the electronic state of an isolated hydrogen atom.

On the basis of the LCAO approximation, when the quantum box 1 and the quantum box 2, initially isolated, approach to each other, a split of the width $2\Delta E$ occurs in the energy level $E_0$ in the ground state $|1>$ of the electron in the quantum box 1 and the ground state $|2>$ of the electron in the quantum box 2, and two states, bonding state and antibonding state, are obtained. Energies and wave functions of these bonding and antibonding states are shown by:

Bonding State $E_{bonding} = E_0 - \Delta E$

Antibonding State $E_{antibonding} = E_0 + E$ \hfill (1)

$|bonding> \alpha [|1> + |2>]$ $|antibonding> \alpha [|1> - |2>]$ \hfill (2)

$\Delta E$ is called transfer energy, and it gives a criterion for determination of the tunneling time $\tau$ of an electron between quantum boxes as referred to later.

If the Hamiltonian of the coupled quantum boxes system is expressed as $\hat{H}_{LCAO}$, then the bonding state $|bonding>$ and the antibonding state $|antibonding>$ exhibit eigenstates of the Hamiltonianas as described by the following equations:

$\hat{H}_{LCAO}|bonding> = (E_0 - \Delta E)|bonding>$ $\hat{H}_{LCAO}|antibonding> = (E_0 + \Delta E)|antibonding>$ \hfill (3)

Assuming that an electron is localized in, for example, the quantum box 1, this state can be expressed as:

$$|initial> = \frac{1}{\sqrt{2}} [|bonding> + |antibonding>] \hfill (4)$$

By time evolution from this state in accordance with the Schrödinger equation, the state at the time t is:

$$
\begin{aligned}
|t\rangle &= \exp\left(i\frac{\hat{H}_{LCAO}t}{\hbar}\right)|\text{initial}\rangle \\
&= \frac{1}{\sqrt{2}}\left[\exp\left(i\frac{\hat{H}_{LCAO}t}{\hbar}\right)|\text{bonding}\rangle + \exp\left(i\frac{\hat{H}_{LCAO}t}{\hbar}\right)|\text{antibonding}\rangle\right] \\
&= \frac{1}{\sqrt{2}}\left[e^{i\frac{(E_0-\Delta E)t}{\hbar}}|\text{bonding}\rangle + e^{i\frac{(E_0-\Delta E)t}{\hbar}}|\text{antibonding}\rangle\right] \\
&= \frac{1}{\sqrt{2}}e^{i\frac{(E_0-\Delta E)t}{\hbar}}[|\text{bonding}\rangle + e^{i\frac{2\Delta E t}{\hbar}}|\text{antibonding}\rangle]
\end{aligned}
\quad (5)
$$

It is known from the above statement that the electron heretofore localized in the quantum box 1 reaches the quantum box 2 by the time t satisfying:

$$\frac{2\Delta E t}{\hbar} = \pi \quad (6)$$

Therefore, within the LCAO approximation, the tunneling time $\tau$ of the electron from the quantum box 1 to the quantum box 2 may be considered as:

$$\tau = \frac{\pi\hbar}{2\Delta E} \quad (7)$$

This tunneling time $\tau$ may more generally be expressed as:

$$\tau \sim \frac{\pi\hbar}{2\Delta E} \quad (8)$$

It is known from the foregoing statement that, by most simplifying the dynamics of electrons in a coupled quantum boxes system, electrons move due to tunnelling dependent on the magnitude of the transfer energy $\Delta E$ between quantum boxes.

Next consideration is made to determine a formula for the transfer energy $\Delta E$ within the LCAO approximation.

Here is taken for consideration a single square quantum box whose side is 2d long. Then its potential energy is:

$$V(x,y) = \begin{cases} -V_0 & (|x|\leq d, |y|\leq d) \\ 0 & (|x|>d, |y|>d) \end{cases} \quad (9)$$

Therefore, the Hamiltonian of the system is:

$$\hat{H}_{isolate} = K + V(x,y) \quad (10)$$

where K is the kinetic energy. When the ground state of the Hamiltonian is $|\psi_0\rangle$ and its energy is $E_0$, $$\hat{H}_{isolate}|\psi_0\rangle = E_0|\psi_0\rangle \quad (11)$$

is established.

In contrast, the Hamiltonian of a coupled quantum boxes system comprising two square quantum boxes can be expressed as:

$$\hat{H}_{coupled} = K + V_+(x,y) + V_-(x,y) \quad (12)$$

When, however, the center coordinates of one of the quantum boxes and the center coordinates of the other of the quantum boxes are written as described above, it results in:

$$V_+(x,y) = V(x-r_x, y-r_y)$$
$$V_-(x,y) = V(x+r_x, y+r_y) \quad (13)$$

On the other hand, the wave function of the ground state of the Hamiltonian of the single square quantum box described by Equation (10) is:

$$\psi_0(x,y) = \langle x,y|\psi_0\rangle \quad (14)$$

Note that the following equations $$\psi_{0+}(x,y) = \psi_0(x-r_x, y-r_y)$$
$$\psi_{0-}(x,y) = \psi_0(x+r_x, y+r_y) \quad (15)$$

respectively satisfy $$[K+V_+]\psi_{0+}(x,y) = E_0\psi_{0+}(x,y)$$
$$[K+V_-]\psi_{0-}(x,y) = E_0\psi_{0-}(x,y) \quad (16)$$

After the foregoing preparation, consideration is made to determine the energy eigenvalue of the Hamiltonian of the coupled quantum boxes system shown by Equation (12) in the two-dimensional subspace spanned by the eigenstates of the single square quantum box described by Equation (15) span. Since two eigenstates described by Equation (15) are not orthogonal, first made are orthogonal bases, for example, as follows:

$$|a\rangle = \frac{1}{\sqrt{2(1-\langle\psi_{0-}|\psi_{0+}\rangle)}}(|\psi_{0+}\rangle - |\psi_{0-}\rangle)$$

$$|b\rangle = \frac{1}{\sqrt{2(1+\langle\psi_{0-}|\psi_{0+}\rangle)}}(|\psi_{0+}\rangle + |\psi_{0-}\rangle) \quad (17)$$

On the basis of the orthogonal bases, Hamiltonian matrix elements are calculated as follows:

$$<a|\hat{H}_{coupled}|a> = \frac{1}{2(1-<\psi_{0-}|\psi_{0+}>)}(<\psi_{0+}|-<\psi_{0-}|)[K+V_++V_-](|\psi_{0+}>-|\psi_{0-}>) \quad (18)$$

$$= \frac{1}{2(1-<\psi_{0-}|\psi_{0+}>)}(<\psi_{0+}|-<\psi_{0-}|)[(K+V_+)|\psi_{0+}>+V_-|\psi_{0+}>-V_+|\psi_{0-}>-(K+V_-)|\psi_{0-}>]$$

$$= \frac{1}{2(1-<\psi_{0-}|\psi_{0+}>)}(<\psi_{0+}|-<\psi_{0-}|)[E_0|\psi_{0+}>+V_-|\psi_{0+}>-V_+|\psi_{0-}>-E_0|\psi_{0-}>]$$

$$= \frac{1}{2(1-<\psi_{0-}|\psi_{0+}>)}(<\psi_{0+}|-<\psi_{0-}|)[E_0|\psi_{0+}>+V_-|\psi_{0+}>-V_+|\psi_{0-}>-E_0|\psi_{0-}>]$$

$$= \frac{1}{2(1-<\psi_{0-}|\psi_{0+}>)}(<\psi_{0+}|-<\psi_{0-}|)[E_0|\psi_{0+}>+V_-|\psi_{0+}>-V_+|\psi_{0-}>-E_0|\psi_{0-}>]$$

$$= \frac{1}{2(1-<\psi_{0-}|\psi_{0+}>)}[2E_0(1-<\psi_{0-}|\psi_{0+}>)+2<\psi_{0+}|V_-|\psi_{0+}>-2<\psi_{0+}|V_+|\psi_{0-}>]$$

$$= E_0 + \frac{<\psi_{0+}|V_-|\psi_{0+}>-<\psi_{0+}|V_+|\psi_{0-}>}{1-<\psi_{0-}|\psi_{0+}>}$$

$$<b|\hat{H}_{coupled}|b> = \frac{1}{2(1+<\psi_{0-}|\psi_{0+}>)}(<\psi_{0+}|+<\psi_{0-}|)[K+V_++V_-](|\psi_{0+}>+|\psi_{0-}>) \quad (19)$$

$$= \frac{1}{2(1+<\psi_{0-}|\psi_{0+}>)}(<\psi_{0+}|+<\psi_{0-}|)[(K+V_+)|\psi_{0+}>+V_-|\psi_{0+}>+V_+|\psi_{0-}>+(K+V_-)|\psi_{0-}>]$$

$$= \frac{1}{2(1+<\psi_{0-}|\psi_{0+}>)}(<\psi_{0+}|+<\psi_{0-}|)[E_0|\psi_{0+}>+V_-|\psi_{0+}>+V_+|\psi_{0-}>+E_0|\psi_{0-}>]$$

$$= \frac{1}{2(1+<\psi_{0-}|\psi_{0+}>)}(<\psi_{0+}|+<\psi_{0-}|)[E_0|\psi_{0+}>+V_-|\psi_{0+}>+V_+|\psi_{0-}>+E_0|\psi_{0-}>]$$

$$= \frac{1}{2(1+<\psi_{0-}|\psi_{0+}>)}(<\psi_{0+}|+<\psi_{0-}|)[E_0|\psi_{0+}>+V_-|\psi_{0+}>+V_+|\psi_{0-}>+E_0|\psi_{0-}>]$$

$$= \frac{1}{2(1+<\psi_{0-}|\psi_{0+}>)}[2E_0(1+<\psi_{0-}|\psi_{0+}>)+2<\psi_{0+}|V_-|\psi_{0+}>+2<\psi_{0+}|V_+|\psi_{0-}>]$$

$$= E_0 + \frac{<\psi_{0+}|V_-|\psi_{0+}>+<\psi_{0+}|V_+|\psi_{0-}>}{1+<\psi_{0-}|\psi_{0+}>}$$

$$<b|\hat{H}_{coupled}|a> = 0 \quad (20)$$

$$<a|\hat{H}_{coupled}|b> = 0 \quad (21)$$

Note that the calculation of these matrix elements used Equation (16) and the following equations:

$$<\psi_{0+}|V_-|\psi_{0+}> = <\psi_{0-}|V_+|\psi_{0-}>$$

$$<\psi_{0+}|V_-|\psi_{0-}> = <\psi_{0+}|V_+|\psi_{0-}> \quad (22)$$

As apparent from Equations (20) and (21), since non-diagonal elements of the Hamiltonian matrix are zero, the Hamiltonian matrix is in fact diagonalized. Therefore, energy eigenvalues are:

$$<b|\hat{H}_{coupled}|b>, <a|\hat{H}_{coupled}|a>$$

and their eigenvectors are:

$$|b> = |bonding>, |a> = |antibonding> \quad (23)$$

In Equations (18) and (19), because of the localization of the wave function, $$1 >> <\psi_{0-}|\psi_{0+}>$$

$$<\psi_{0+}|V_-|\psi_{0+}> << <\psi_{0+}|V_+|\psi_{0-}> \quad (24)$$

are established, and so energies may be considered as:

$$E_{antibonding} \sim E_0 + \Delta E$$

$$E_{bonding} \sim E_0 - \Delta E$$

$$\Delta E = |<\psi_{0+}|V_+|\psi_{0-}>| \quad (25)$$

When the transfer energy $\Delta E$ is small, electrons tends to be localized in respective quantum boxes, and movements of electrons among quantum boxes due to tunneling are suppressed. On the other hand, when the transfer energy $\Delta E$ is large, electrons moves among quantum boxes dut to tunneling.

In the quantum device having the structure according to the first aspect of the invention, since the quantum boxes are asymmetric in the direction orthogonal to the plane of their arrangement at least in one of composition of materials constituting the quantum box and geometry of the quantum box, control of the distribution of wave functions of electrons or holes in the quantum boxes by application of an external electric field in the direction results in an efficient modulation of correlations among electrons or holes in the quantum boxes array comprising the quantum boxes.

In the carrier conductivity modulating quantum device having the structure according to another aspect of the invention, since each quantum box included in the regions is asymmetric in a direction orthogonal to the plane in composition of materials constituting the quantum box or in geometry of the quantum box, control of the distribution of wave functions of electrons or holes in the quantum boxes by application of an external electric field in the direction results in an efficient modulation of correlations among electrons or holes in the quantum boxes. Accordingly, a current from one end to another end of the quantum boxes array through the regions can be modulated efficiently by an external electric field, and a behavior as a transistor can be realized.

The above, and other, objects, features and advantage of the present invention will become readily apparent from the following detailed description thereof which is to be read in connection with the accompanying drawings.

BRIEF DESCRIPTION OF THE DRAWINGS

FIG. 25 is a plan view of a quantum device according to a seventh embodiment of the invention;

DETAILED DESCRIPTION OF THE PREFERRED EMBODIMENTS

First explain ed is Mott transition, a kind of metal-insulator phase transitions, (N. F. Mott, Philos. Mag. 6, 287(1961) and metal-insulator transitions (Taylor & Francis Ltd, London, 1974)) by using a Hubbard picture (J. Hubbard, Proc. Roy. Soc. (London), A276, 238(1963), A277, 237(1963), A281, 401(1964)).

Transfer energy T (=ΔE) representing the movability of electrons between adjacent sites (atoms in crystals such as transition metals, and quantum dots in quantum dots arrays) may be regarded as the band width when no interaction between electrons is taken into consideration. The coulomb energy with two electrons in a single site is written here as on-site coulomb energy U.

Figure 1A:
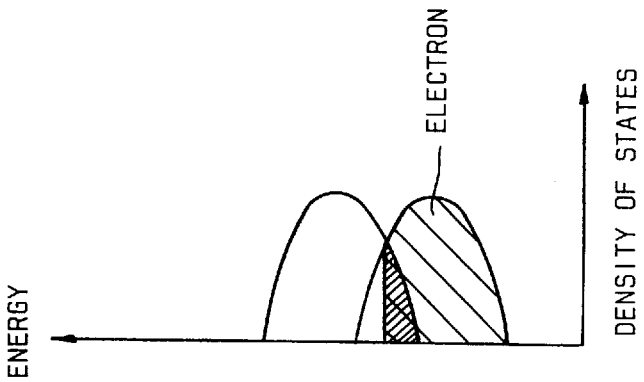
FIGS. 1A to 1C are schematic views for explaining the principle of the present invention.
Figure 1B:
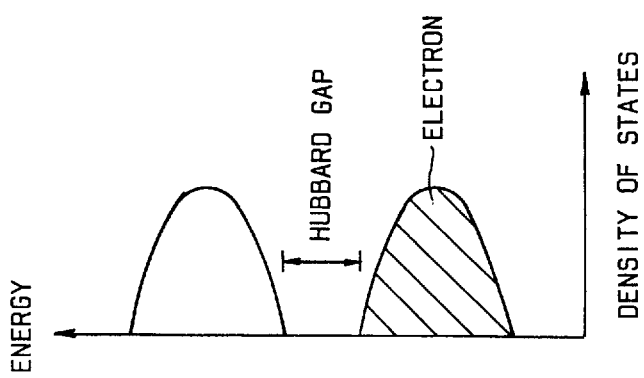
Figure 1C:
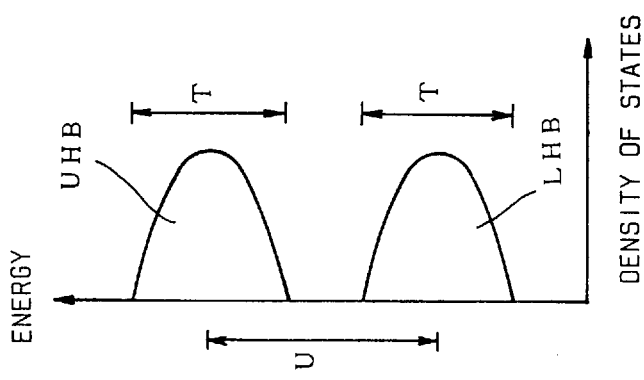

An energy band diagram reduced to one electron in this condition is as shown in FIG. 1A. The subband in the higher energy side in FIG. 1A is called an upper Hubbard band (UHB), and the subband in the lower energy side is called a lower Hubbard band (LHB). In case of a half-filled state with one electron in each site, when LHB and UHB are isolated from each other, that is, when U is large or T is small, electrons exist only in UHB (FIG. 1B). In this case, low energy excitation of electrons has a gap (Hubbard gap) and the system behaves like an insulator. On the other hand, when U becomes small or T becomes large, LHB and UHB overlap, which generates an empty state in a part of LHB, and electrons in this part enter in UHB (FIG. 1C). As a result, the system behaves like a semi-metal. When this tendency develops, the system behaves like a metal.

In a quantum dots array with an arrangement of quantum dots in a close relationship, U can be increased by decreasing the scale of each quantum dot. Similarly, T can be decreased by increasing distances between adjacent quantum dots. Therefore, a Mott transition can be brought about by adjusting T and U.

Here taken for an example is a system having three quantum dots arrays are arranged in a sequentially continuous relationship. In this case, by an appropriate adjustment of T and U in each quantum dots array, it is possible for the first and third quantum dots arrays to exhibit a metal phase and for the second quantum dots array to exhibit an insulator phase due to its Hubbard gap. When an attempt is made to move electrons from the first quantum dots array of the metal phase to the third quantum dots array also of the metal phase, the Hubbard gap of the second quantum dots array of the insulator phase behaves to prevent it; nevertheless, conduction occurs due to a quantum-mechanical tunnelling effect (which is called a Hubbard gap tunnelling). That is, through the Hubbard gap due to a many-body effect caused by a coulomb interaction among electrons, a many-body tunnelling phenomenon occurs (even in the metal phase, excitation of electric charges is a collective excitation of the many-body system). Therefore, if two regions, for example, in an insulator phase are provided in a close relationship to behave as barriers, a resonant tunnelling effect is observed, that is, a resonant tunnelling diode can be realized. The "many-body effect" here pertains to one of effects characterizing behaviors of a system with many electrons, which is caused by the interaction among electrons.

The coulomb interaction among electrons is in inverse proportion to the distance between electrons. In case of a quantum dots array, U is inversely proportional to the dot diameter. Since the coulomb interaction among electrons power-functionally vary unlike exponentially variable amounts, it is not so sensitive to fluctuations in size of the quantum dots. Therefore, no strict uniformity is required when using the coulomb effect, which makes fabrication of such a device relatively easy.

Next explained the Mott-Stark effect. Here taken is a case with one electron in each quantum dot of a quantum dots array (half-filled case). In this condition, by varying the ratio $\eta = T/U$ of the transfer energy T between quantum dots relative to the on-site coulomb energy U by applying an external electric field, which causes a drastic change in electric conductivity of the electron system, a Mott metal-insulator transition can be brought about. This is the Mott-Stark effect.

The Mott-Stark effect appears effectively when quantum dots of the quantum dots array are asymmetric in the direction for applying an external electric field. Therefore, with a system, taken for an example, which includes a first region comprising a quantum dots array with an arrangement of asymmetric quantum dots and a second region comprising a quantum dots array with an arrangement of quantum dots with no asymmetry (symmetric quantum dots), a state can be realized where, in response to a uniform application of an external electric field, the Mott-Stark effect appears in the first region, but not in the second region. In another example which includes a first region comprising a quantum dots array with an arrangement of quantum dots asymmetric in a first direction and a second region comprising a quantum dots array with an arrangement of quantum dots asymmetric in a second direction opposite to the first direction, it is possible, for example, that an external electric applied in the first direction makes the first region to behave as a Mott insulator and the second region to exhibit a metal phase due to the Mott-Stark effect, and that an external electric field applied in the second direction makes the first region to exhibit a metal phase and the second region to behave as a Mott insulator due to the Mott-Stark effect. That is, by inverting the external field applying direction, a tunnelling barrier region and a conduction region can be interchanged.

Explained below are some embodiments of the invention with reference to the drawings.

Figure 2:
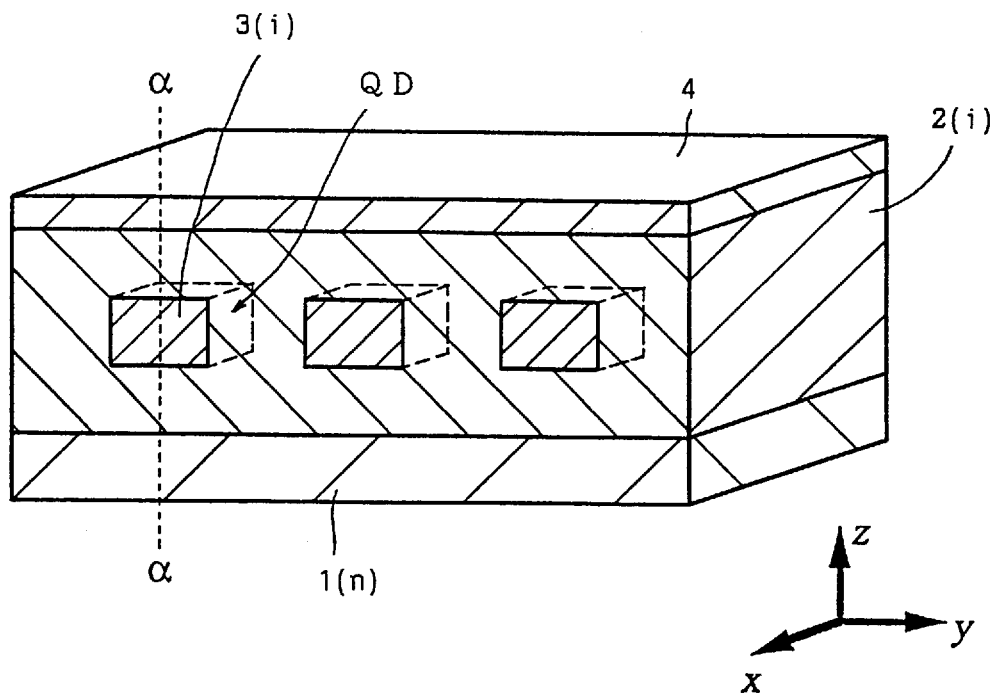
FIG. 2 is a perspective view of a quantum device according to a first embodiment of the invention.

FIG. 2 shows a quantum device according to a first embodiment of the invention.

As shown in FIG. 2, the quantum device includes an n-type GaAs substrate 1 on which an i-type AlAs layer 2 is formed as a barrier layer. Embedded in the i-type AlAs layer 2 are a plurality of i-type $Al_xGa_{1-x}As$ layers 3 as quantum wells in a given two-dimensional arrangement on an x-y plane, each having, for example, a rectangular parallelopiped. The structure with each i-type $Al_xGa_{1-x}As$ layer 3 as the quantum well surrounded by the i-type AlAs layer 2 as the barrier layer makes each quantum dot QD with the $AlAs/Al_xGa_{1-x}As$ heterojunction, and a plurality of such quantum dots QD in a two-dimensional arrangement on the x-y plane make up a two-dimensional quantum dots array. The size of each quantum dot QD and the distance between adjacent quantum dots QD are chosen to be, for example, 10 nm, approximately. Made on the i-type AlAs layer 2 as the barrier layer is an electrode 4 made of a conductive material such as metals. In this case, the n-type GaAs substrate 1 is used as the counterpart electrode. For operation of the quantum device according to the first embodiment, the n-type GaAs substrate 1 behaving as the counterpart electrode is connected to ground, and a voltage is applied to the electrode 4, for example.

In the quantum device according to the first embodiment, composition of each quantum dot QD changes in the z-axis direction orthogonal to the x-y plane, and hence each quantum dot QD is asymmetric in composition in the z-axis direction. More specifically, the mixture ratio (Al composition ratio) x is a function of z-coordinate, typically linear.

Figure 3:
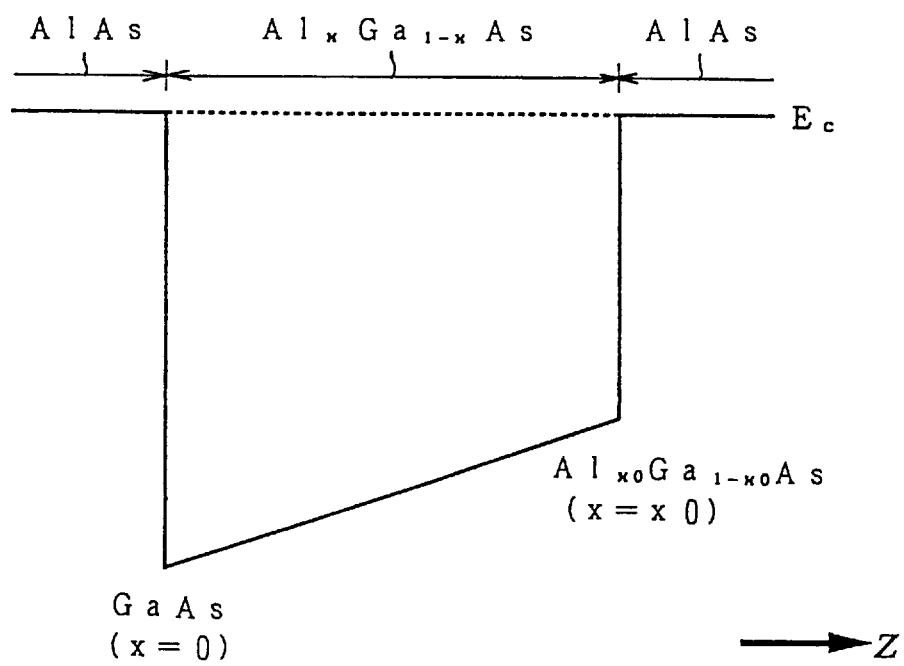
FIG. 3 is an energy band diagram taken along the α—α line of FIG. 1.

A corresponding energy band structure along the α—α line (z-axis direction) of FIG. 2 is shown in FIG. 3. In this case, the mixture ratio x of the i-type $Al_xGa_{1-x}As$ layer 3 linearly, monotonously increases in the positive direction of the z-axis from the value, 0, at its lower interface with the i-type AlAs layer 2 to the value, x0 (for example, 0.1), at its upper interface with the i-type AlAs layer 2. As a result, the bottom energy Ec of the conduction band of the i-type $Al_xGa_{1-x}As$ layer 3 monotonously increases in the positive direction of the z-axis.

Figure 4:
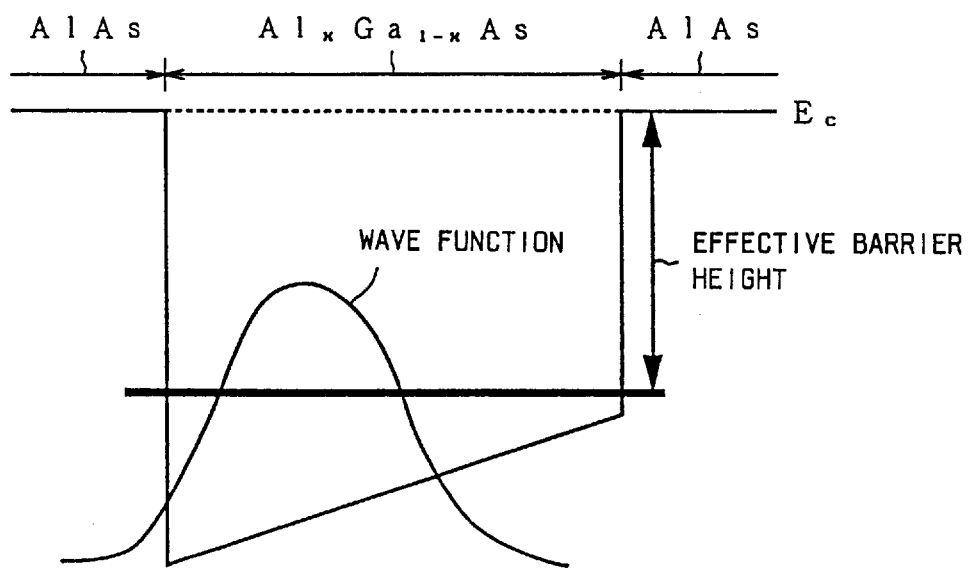
FIG. 4 is an energy band diagram for explaining the principle of operation of the quantum device according to the first embodiment.

Assume that the electron state in the quantum dot QD is as shown in FIG. 4 when no potential difference exists between the electrode 4 and the n-type GaAs substrate 1 behaving as the other electrode, that is, when no external electric field is applied in the z-axis direction. In this state, distribution of wave functions of electrons in the quantum dot QD is deflected to the negative side of the z-axis (left side in FIG. 4). Then the effective barrier height for quantum confinement of electrons in the quantum dot QD is as shown in FIG. 4.

Figure 5:
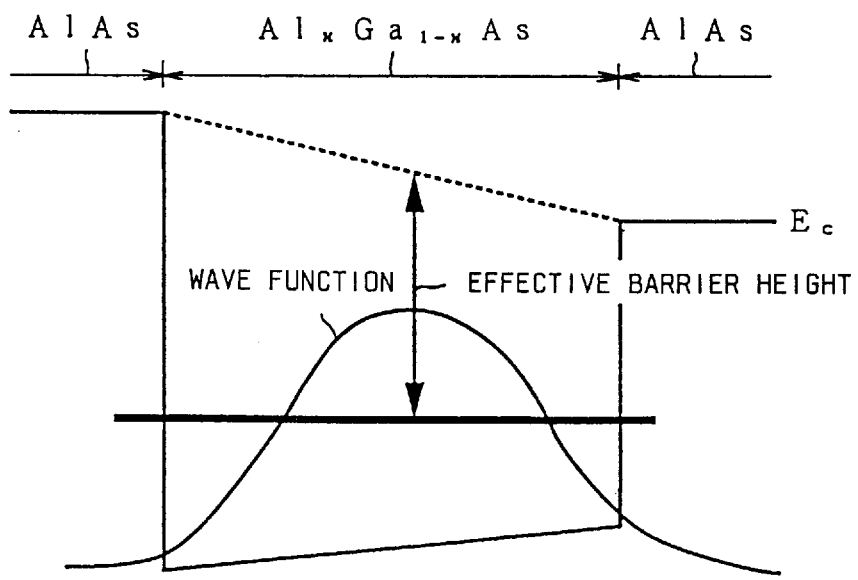
FIG. 5 is an energy band diagram for explaining the principle of operation of the quantum device according to the first embodiment.

By making the potential of the electrode 4 higher than that of the n-type GaAs substrate 1, for example, by connecting the n-type GaAs substrate 1 to ground and applying a positive voltage to the electrode 4, an external electric field is applied in the negative direction of the z-axis. Then, as shown in FIG. 5, distribution of wave functions of electrons in the quantum dot QD shifts to the positive side of the z-axis (right side of FIG. 5), that is, to the side higher in potential. Then the effective barrier height in the quantum dot QD is as shown in FIG. 5 where it is a little lower than that before application of the external electric field. Therefore, the electron existence probability becomes higher in the side with a lower one of the tunnelling barriers which separate the quantum dot QD from adjacent other quantum dots QD, that is, in adjacent quantum dots QD in the positive side of the z-axis. As a result, the transfer energy T between adjacent quantum dots QD increases.

At that time, taking a view of a single quantum dot QD, wave functions of electrons extend in the z-axis direction due to the external electric field, and the strength of quantum confinement of electrons is small. On the other hand, since an on-site coulomb energy U generally increases with increase in strength of quantum confinement, U decreases with an external electric field. Therefore, application of the external electric field results in T→increase U→decrease which shows that R=T/U increases drastically. By using this method, correlations of electrons in the quantum dots array can be modulated efficiently by an external electric field.

Figure 6:
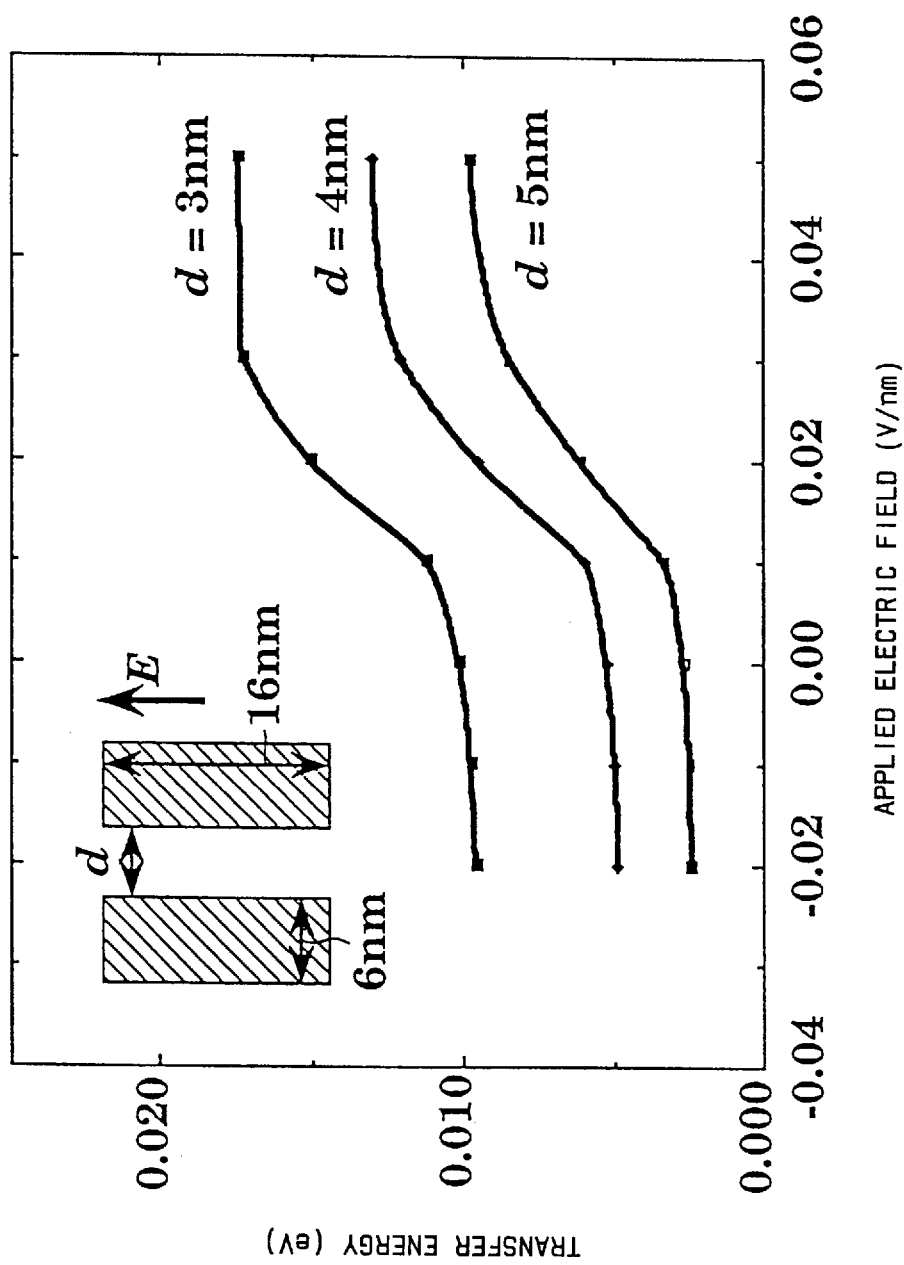
FIG. 6 is a graph showing a result of calculation of dependency of transfer energies upon applied electric fields.

Shown in FIG. 6 is a result of calculation of changes in transfer energy T in response to some magnitudes of applied electric field by using as a parameter the distance d between adjacent quantum dots. In the calculation, each quantum dot is 16 nm long in the z-axis direction and has a square cross section with each side being 6 nm long when taken along a plane orthogonal to the z-axis direction. FIG. 6 shows that application of an electric field causes large changes in transfer energy in any case of d=3 nm, 4 nm, and 5 nm.

Explained below is a process for manufacturing the quantum device having the above-described arrangement according to the first embodiment.

Figure 7:
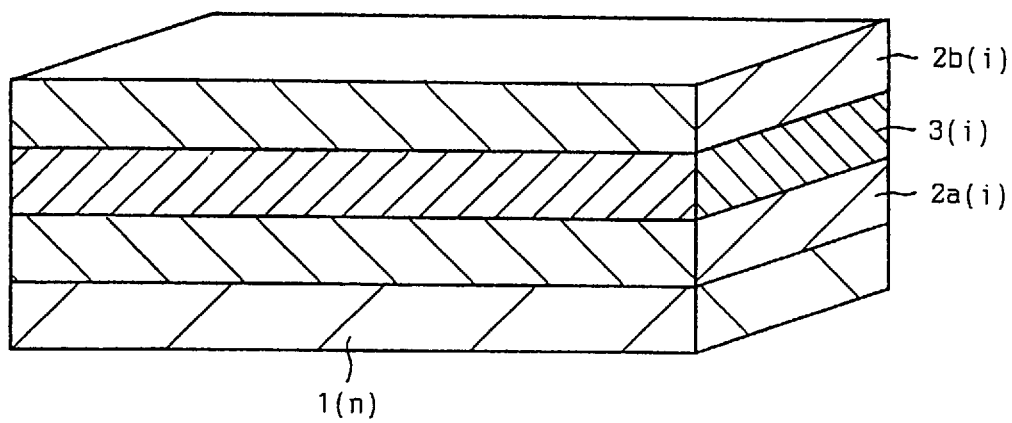
FIG. 7 is a perspective view for explaining a manufacturing process of the quantum device according to the first embodiment.
Figure 8:
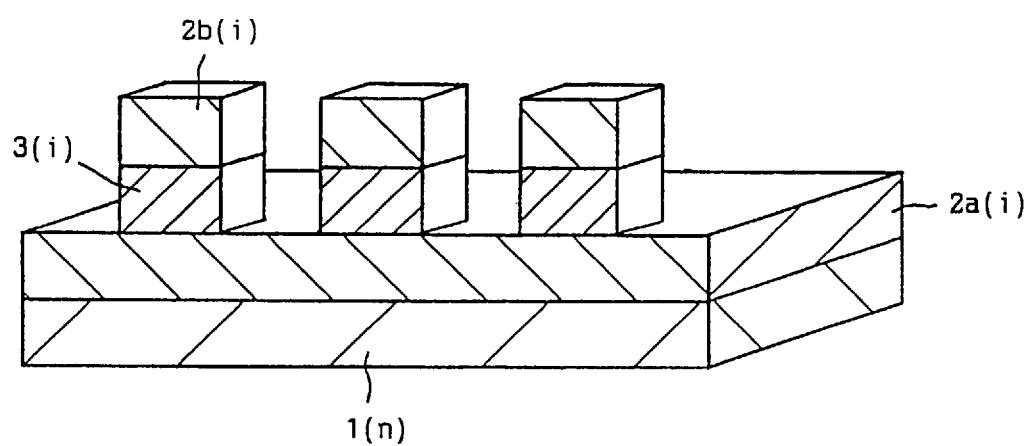
FIG. 8 is a perspective view for explaining the manufacturing process of the quantum device according to the first embodiment.

As shown in FIG. 7, epitaxially grown on an n-type GaAs substrate 1 are an i-type AlAs layer 2a, i-type $Al_xGa_{1-x}As$ layer 3 and i-type AlAs layer 2b in sequence by, for example, metallorganic chemical vapor deposition (MOCVD). The epitaxial growth of the i-type $Al_xGa_{1-x}As$ layer 3 is executed while varying the mixture ratio x by changing feeding amounts of growth materials.

After that, a resist pattern (not shown) is formed on the i-type AlAs layer 2b to protect selective portions for quantum dots QD by, for example, electron beam lithography. By using the resist pattern as a mask, anisotropic etching is done in the direction perpendicular to the substrate surface by, for example, reactive ion etching (RIE). After the anisotropic etching is continued until exposing the i-type AlAs layer 2a, the resist pattern is removed. As a result, the i-type $Al_xGa_{1-x}As$ layer 3 and the i-type AlAs layer 2b are patterned into quadrangular prisms.

Figure 9:
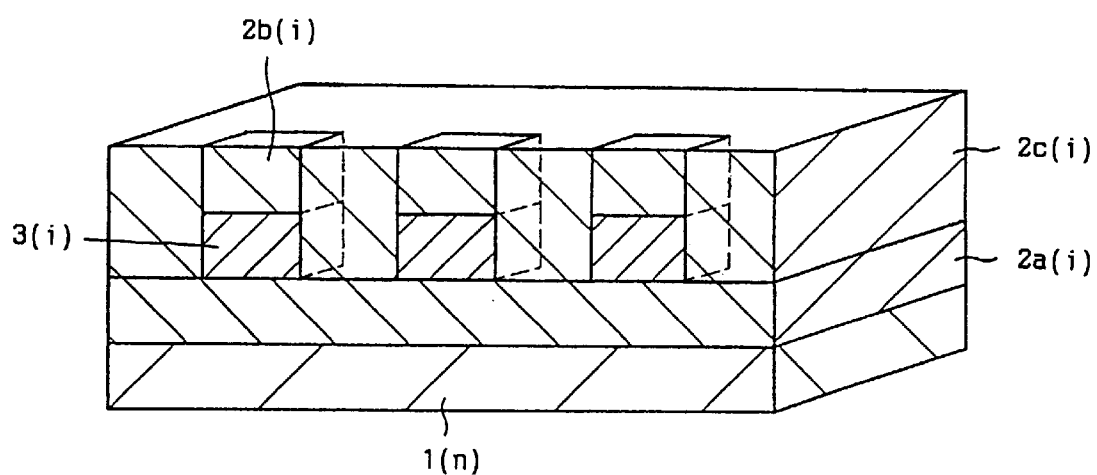
FIG. 9 is a perspective view for explaining the manufacturing process of the quantum device according to the first embodiment.

After that, as shown in FIG. 9, an i-type AlAs layer 2c is epitaxially grown to fill gaps between the quadrangular-prismatic i-type $Al_xGa_{1-x}As$ layer 3 and i-type AlAs layer 2b by, for example, MOCVD. In this case, the entirety of the i-type AlAs layers 2a, 2b and 2c correspond to the i-type AlAs layer 2 of FIG. 2.

Figure 10:
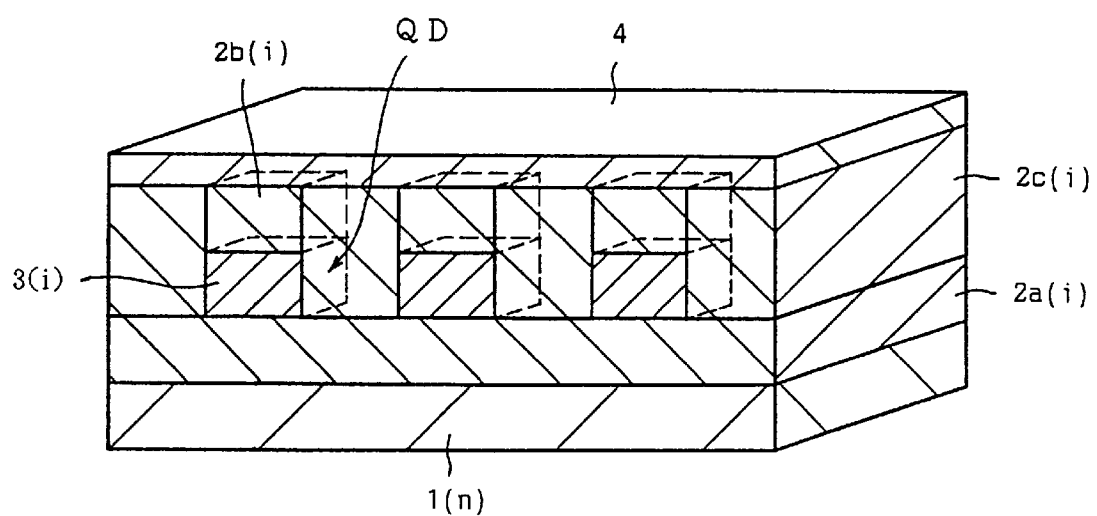
FIG. 10 is a perspective view for explaining the manufacturing process of the quantum device according to the first embodiment.

Next formed is a metal layer on the entire surface of the i-type AlAs layers 2b and 2c by, for example, vacuum evaporation or sputtering. The metal layer, appropriately patterned, if necessary, forms the electrode 4 as shown in FIG. 10. Thus an intended quantum device is completed.

As described above, the first embodiment realizes an efficient modulation of correlations among electrons in a quantum dots array in response to an external electric field in the z-axis direction by using quantum dots QD each asymmetric in composition in the a-axis direction orthogonal to the plane of the arrangement of the quantum dots QD.

Figure 11:
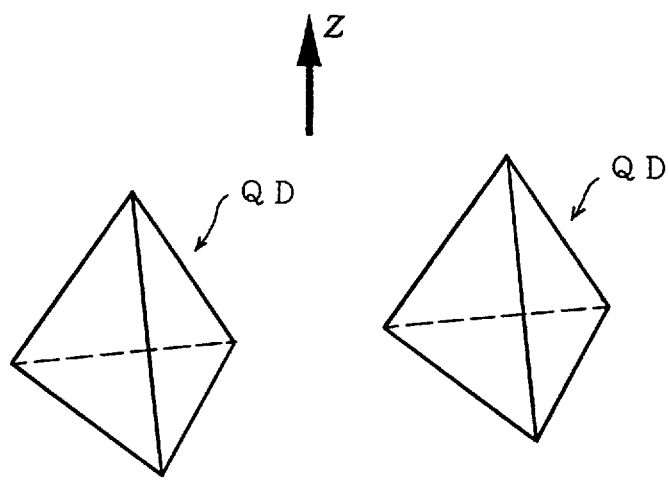
FIG. 11 is a perspective view showing tetrahedral quantum dots.
Figure 12:
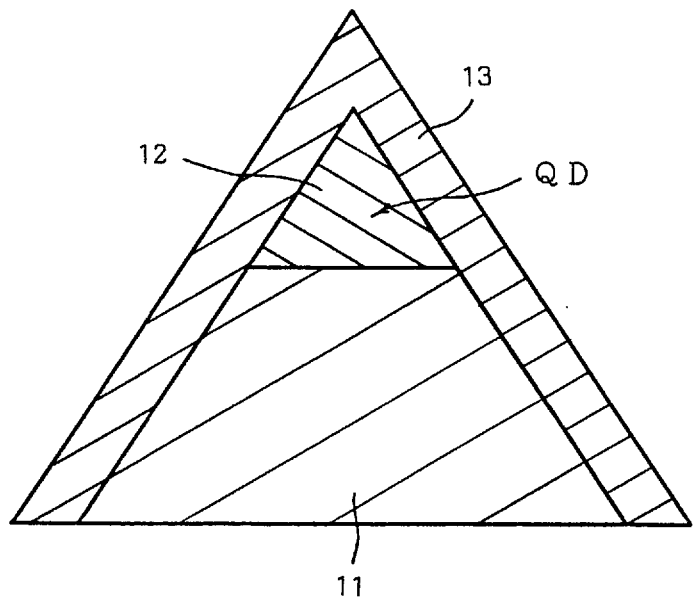
FIG. 12 is a cross-sectional view showing a concrete arrangement of the tetrahedral quantum dot.

Although the first embodiment employs the asymmetry of quantum dots QD in the z-axis direction orthogonal to the plane of their arrangement in terms of their composition; however, equivalent effects are obtained even by an asymmetry of quantum dots QD in the same direction in terms of their shapes. That is, as shown in FIG. 11, the quantum dots array may be made by using tetrahedral quantum dots QD which are asymmetric in the z-axis direction in shape. These tetrahedral quantum dots QD can be made by a process, for example, as shown in FIG. 12. That is, a $SiO_2$ film, for example, is first formed on the entire surface of a GaAs substrate (not shown) and then selectively etched to make triangular openings. In these openings, an AlGaAs layer 11 is first epitaxially grown on the GaAs substrate, and a GaAs layer 12 is epitaxially grown on the AlGaAs layer 11 in the form of triangular pyramids. After that, an AlGaAs layer 13 is epitaxially grown to cover the triangular pyramids.

Next explained is a second embodiment of the invention using such a geometrical asymmetry of quantum dots QD.

Figure 13:
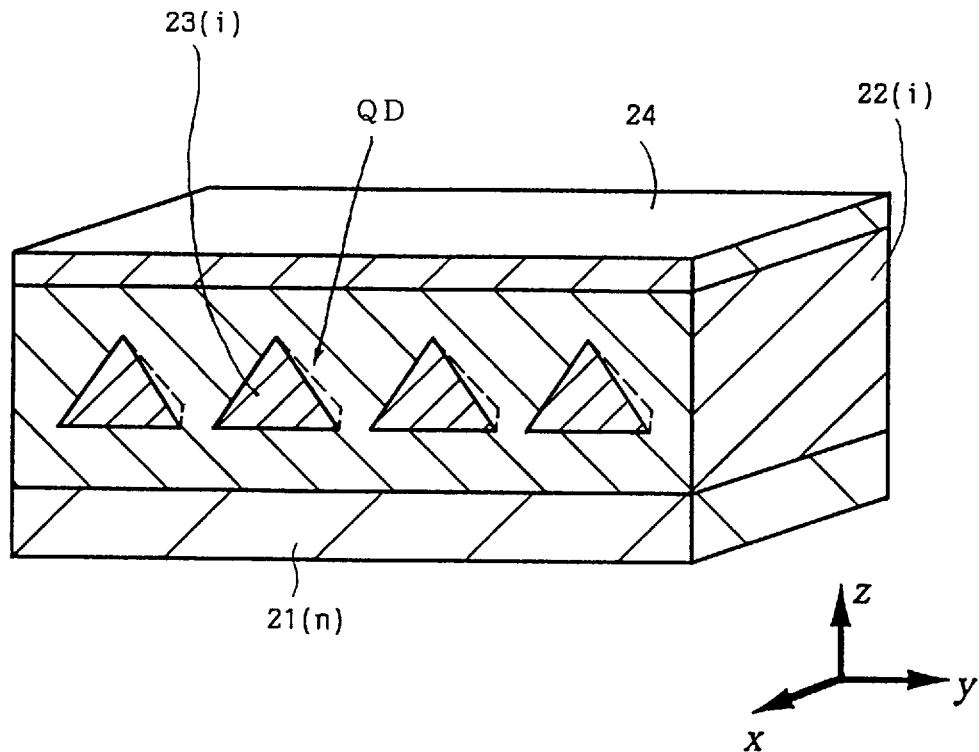
FIG. 13 is a perspective view showing a quantum device according to a second embodiment of the invention.

FIG. 13 shows a quantum device according to the second embodiment.

As shown in FIG. 13, the quantum device according to the second embodiment comprises an n-type GaAs substrate 21 and an i-type $Al_yGa_{1-y}As$ layer 22 formed on the n-type GaAs substrate 21 and behaving as a barrier layer. Embedded in the i-type $Al_yGa_{1-y}As$ layer 22 are a plurality of i-type GaAs layers 23 in a given two-dimensional arrangement on the x-y plane, each having a tetrahedral geometry and behaving as a quantum well. The structure comprising each i-type GaAs layer 23 as a quantum well surrounded by the i-type $Al_yGa_{1-y}As$ layer 22 as a barrier layer forms a quantum dot QD having the $Al_yGa_{1-y}As$/GaAs heterojunction, and a plurality of such quantum dots QD in a two-dimensional arrangement on the x-y plane make up a two-dimensional quantum dots array. The size of each quantum dot QD is, for example, 10 nm, approximately, and the distance between adjacent quantum dots QD is, for example, 10 nm, approximately, in terms of the average of their maximum and minimum distances. Further formed on the i-type $Al_yGa_{1-y}As$ layer 22 as the barrier layer is an electrode 24 made of a conductor such as metals. In this case, the n-type GaAs substrate 21 is used as the counterpart electrode. As in the quantum device according to the first embodiment, also for operation of the quantum device according to the second embodiment, the n-type GaAs substrate 21 as the counterpart electrode is connected to ground, and a voltage is applied to the electrode 24, for example.

In the quantum device according to the second embodiment, each quantum dot QD has a geometrical asymmetry in the z-axis direction because of the tetrahedral configuration of each i-type GaAs layer 23 as a quantum well. The cross-sectional area of each quantum dot QD monotonously increases in the positive direction of the z-axis, when taken along planes parallel to the x-y plane. Accordingly, the distance between adjacent quantum dots QD monotonously increases in the positive direction of the z-axis as shown in FIG. 14.

Explained below is the principle of operation of the quantum device having the above-described structure according to the second embodiment.

By making the potential of the electrode 24 lower than that of the n-type GaAs substrate 21 as the counterpart electrode, for example, by connecting the GaAs substrate 21 to ground and applying a negative voltage to the electrode 24, an external electric field is applied in the positive direction of the z-axis. In receipt of a force in the negative direction of the z-axis, electrons in each quantum dot QD are pulled to a lower portion of the quantum dot QD in FIG. 14. That is, distribution of wave functions of electrons in each quantum dot QD deflects to the negative side of the z-axis. Accordingly, the distance between adjacent quantum dots QD decreases effectively, and the width of the barrier between adjacent quantum dots QD hence decreases effectively. Therefore, electrons become easy to move between adjacent quantum dots QD by tunnelling, and the transfer energy T increases.

Figure 14:
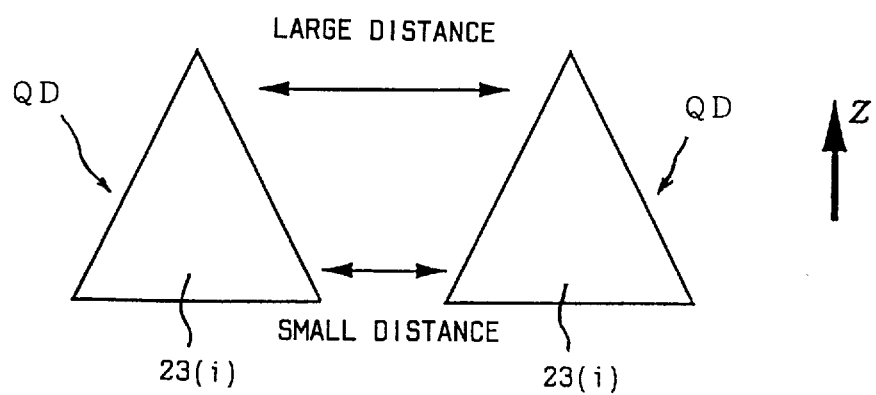
FIG. 14 is a schematic view for explaining the principle of operation of the quantum device according to the second embodiment.

In contrast, when the direction of external electric field is opposite, that is, the negative direction of the z-axis, electrons in each quantum dot QD receive a force in the positive direction of the z-axis, and are forced to move to an upper portion of the quantum dot QD in FIG. 14, that is, to the vertex of the tetrahedron. In other words, distribution of wave functions of electrons in each quantum dot QD deflects to the positive side of the z-axis. At this time, the distance between adjacent quantum dots QD increases effectively, and the width of the barrier between adjacent quantum dots QD hence increases effectively. Therefore, electrons become difficult to move between adjacent quantum dots QD by tunnelling, and the transfer energy T decreases.

In the above-described manner, the transfer energy T between quantum dots QD can be modulated efficiently by application of an external electric field in the z-axis direction.

As explained with the first embodiment, here again, when the quantum dots array is half-filled, that is, in the density of electrons with one electron existing in each quantum dot QD, the electric conductivity of the electron system drastically changes with $R=T/U$. That is, an external electric field in the z-axis direction provides efficient modulation of correlations among electrons of the electron system in the quantum dots array, which in turn provides efficient modulation of $R=T/U$.

When the arrangement of quantum dots QD in the quantum dots array is periodical, the width of a subband made by the periodicity is proportional to the transfer energy T. Apparently, therefore, the width of such a subband in quantum dots array having a periodical arrangement of quantum dots QD can be efficiently modulated. The subband width modulating method may be applied to velocity modulating transistors, for example (Jpn. J. Appl. Phys. 21, L381 (1982)).

Explained below is a process for manufacturing the quantum device according to the second embodiment.

Figure 15:
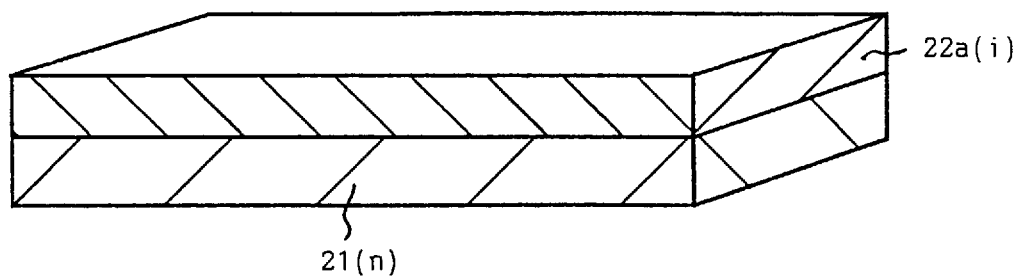
FIG. 15 is a perspective view for explaining a manufacturing process of the quantum device according to the second embodiment.

As shown in FIG. 15, an i-type $Al_yGa_{1-y}As$ layer 22a is first epitaxially grown on the n-type GaAs substrate 21 by, for example, MOCVD.

Figure 16:
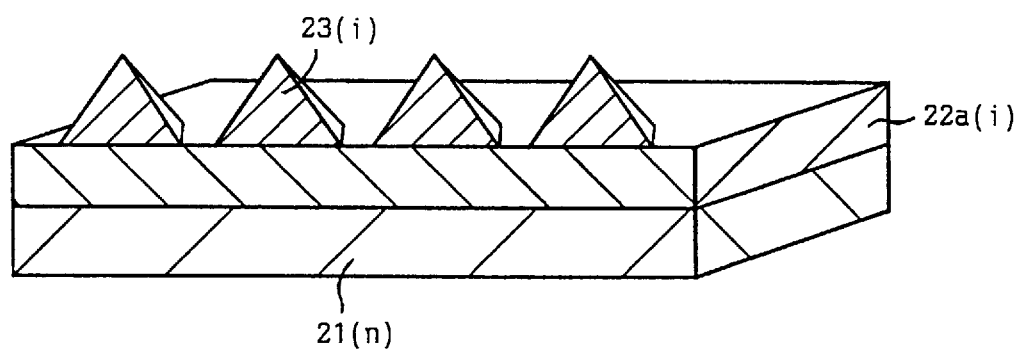
FIG. 16 is a perspective view for explaining the manufacturing process of the quantum device according to the second embodiment.
Figure 17:
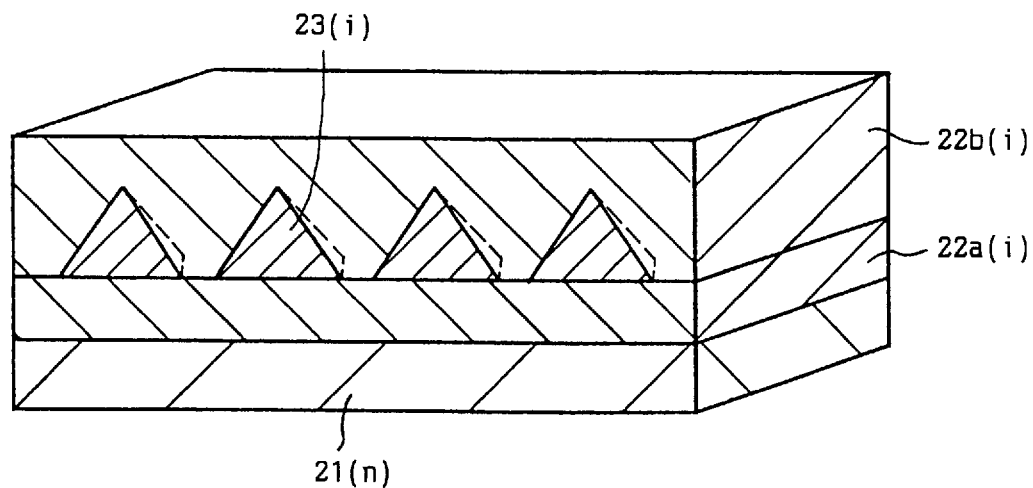
FIG. 17 is a perspective view for explaining the manufacturing process of the quantum device according to the second embodiment.

After that, as shown in FIG. 16, tetrahedral i-type GaAs layers 23 as quantum well layers are formed in a two-dimensional arrangement on the i-type $Al_yGa_{1-y}As$ layer 22a, for example, by a method proposed by Fukui et al. (T. Fukui, S. Ando, and H. Saito, Science and Technology of Mesoscopic Structures, p.353, ed. S. Namba, C. Hamaguchi, and T. Ando (springer-Verlag, Tokyo, 1992)). That is, a $SiO_2$ film (not shown), for example, is formed on the entire surface of the i-type $Al_yGa_{1-y}As$ layer 22a by CVD and then selectively etched to make regular-triangular openings in a two-dimensional array. After that, an i-type GaAs layer is epitaxially grown. As a result, selective epitaxial growth of tetrahedral i-type GaAs layers 23 is obtained in the openings on the i-type $Al_yGa_{1-y}As$ layer 22a as shown in FIG. 16. The $SiO_2$ film used for the selective epitaxial growth is subsequently etched off, and an i-type $Al_yGa_{1-y}As$ layer 22b is epitaxially grown as shown in FIG. 17 by, for example, MOCVD so as to fill the gaps between the tetrahedral i-type GaAs layers 23. In this case, the entirety of the i-type $Al_yGa_{1-y}As$ layers 22a and 22b corresponds to the i-type $Al_yGa_{1-y}As$ layers 22 of FIG. 13.

After that, a metal film is deposited on the entire surface of the i-type $Al_yGa_{1-y}As$ layer 22b by, for example, vacuum evaporation or sputtering, and subsequently patterned, if necessary, to form the electrode 24 as shown in FIG. 13. An intended quantum device is thus completed.

As explained above, the second embodiment also realizes an efficient modulation of correlations among electrons in a quantum dots array in response to an external electric field in the z-axis direction by using a geometrical asymmetry of quantum dots QD in the z-axis direction orthogonal to the plane of their arrangement.

Figure 18:
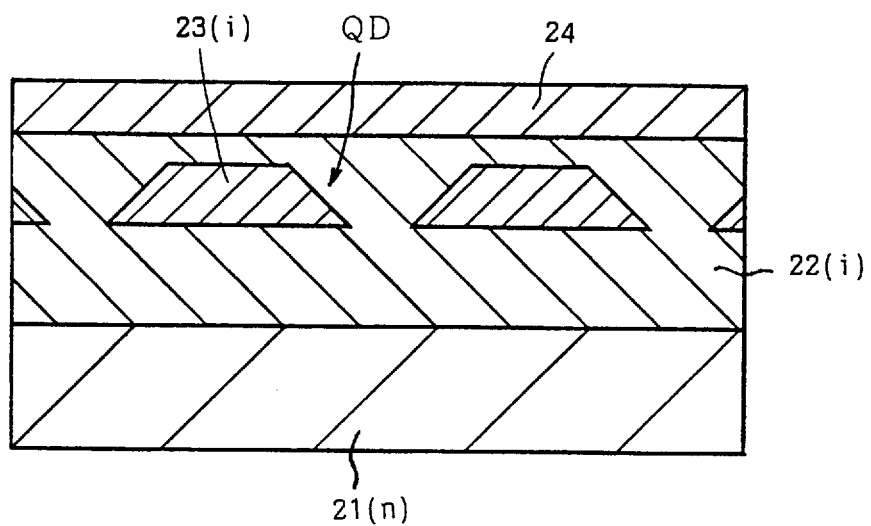
FIG. 18 is a perspective view showing a quantum device according to a third embodiment of the invention.

FIG. 18 shows a quantum device according to a third embodiment of the invention.

As shown in FIG. 18, the quantum device according to the third embodiment uses quantum dots QD in which the i-type GaAs layer 23 behaving as a quantum well has a shape made by cutting off a vertex of, for example, a quadrangular pyramid along a plane parallel to its opposed bottom surface. Because of this shape of the i-type GaAs layer 23 behaving as a quantum well, each quantum dot QD has a geometrical asymmetry in the z-axis direction. In this case, each quantum dot QD monotonously decreases in cross-sectional area in the positive direction of the z-axis when taken along planes parallel to the x-y plane, and the distance between adjacent quantum dots QD monotonously increases in the positive direction of the z-axis.

In the other respects, construction of the quantum device according to the third embodiment is the same as that of the quantum device according to the second embodiment, and is therefore omitted from explanation. Also the principle of operation of the quantum device according to the third embodiment is the same as that of the second embodiment, and is omitted from explanation.

Explained below is a process for manufacturing the quantum device according to the third embodiment.

Figure 19:
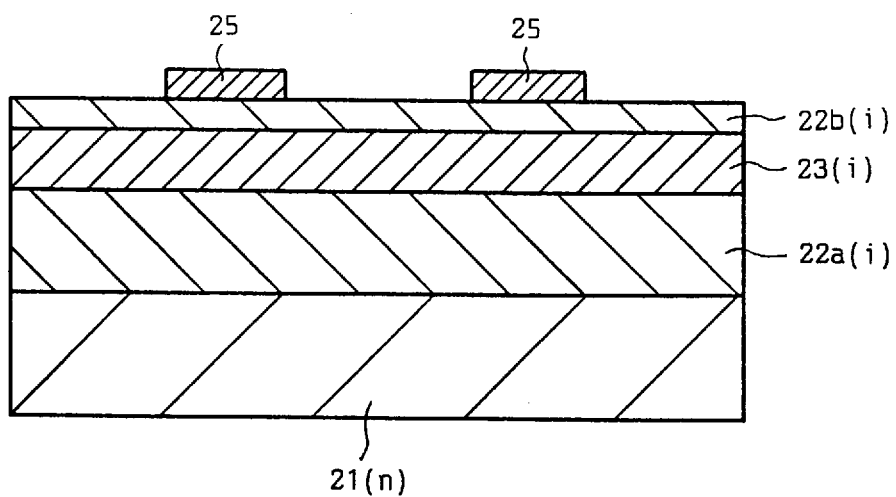
FIG. 19 is a schematic view for explaining a manufacturing process of the quantum device according to the third embodiment.

As shown in FIG. 19, epitaxially grown on an n-type GaAs substrate 21 are an i-type $Al_yGa_{1-y}As$ layer 22a, i-type GaAs layer 23 and i-type $Al_yGa_{1-y}As$ layer 22b in sequence by, for example, MOCVD. Subsequently formed on the i-type $Al_yGa_{1-y}As$ layer 22b is a mask 25 having a pattern corresponding to quantum dots QD to be made. The mask 25 is made of, for example, a resist.

Figure 20:
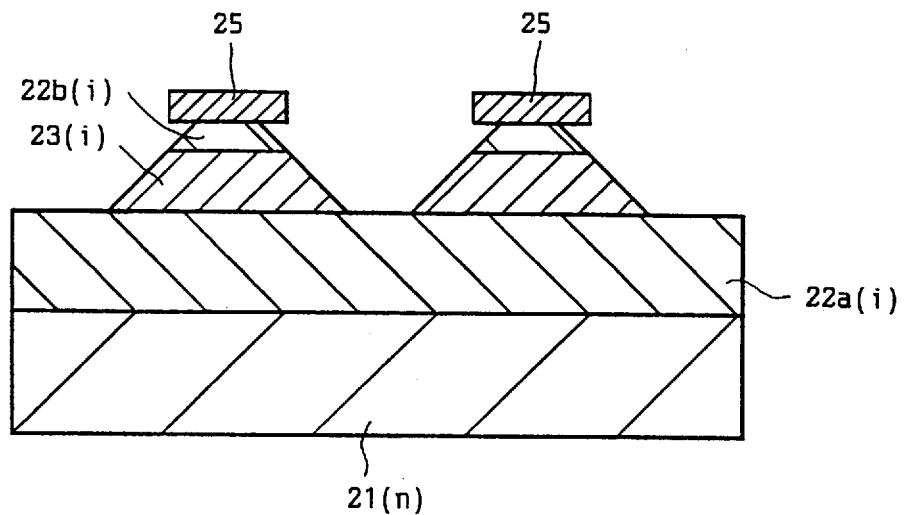
FIG. 20 is a schematic view for explaining the manufacturing process of the quantum device according to the third embodiment.

By using the mask 25, the i-type $Al_yGa_{1-y}As$ layer 22b and the i-type GaAs layer 23 are selectively etched off by, for example, wet etching under a condition where the side etching increases. As a result, the i-type $Al_yGa_{1-y}As$ layer 22b and the i-type GaAs layer 23 are patterned into quadrangular pyramids without vertexes as shown in FIG. 20.

Figure 21:
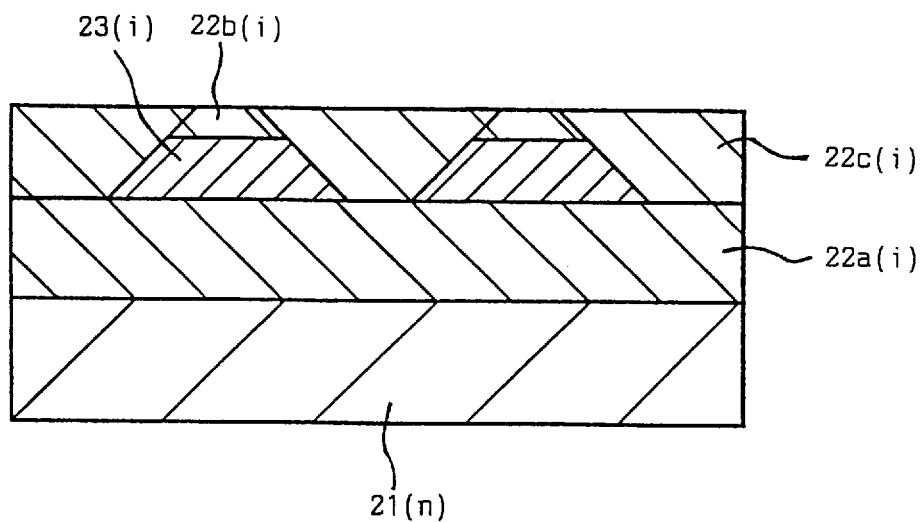
FIG. 21 is a schematic view for explaining the manufacturing process of the quantum device according to the third embodiment.

After the mask 25 is removed, an i-type $Al_yGa_{1-y}As$ layer 22c is epitaxially grown by, for example, MOCVD to fill gaps between the vertex-cutout, quadrangular-pyramids of the i-type $Al_yGa_{1-y}As$ layers 22b and the i-type GaAs layers 23 as shown in FIG. 21. In this case, the entirety of the i-type $Al_yGa_{1-y}As$ layers 22a, 22b and 22c corresponds to the i-type $Al_yGa_{1-y}As$ layer 22 of FIG. 18.

After that, a metal film is formed on the i-type $Al_yGa_{1-y}As$ layers 22b and 22c by, for example, vacuum evaporation or sputtering, and subsequently patterned, if necessary, to form the electrode 24 as shown in FIG. 18. Thus an intended quantum device is completed.

Also the third embodiment realizes the same advantages as those of the second embodiment.

Explained below a fourth embodiment of the invention directed to an application to a field effect transistor.

Figure 22:
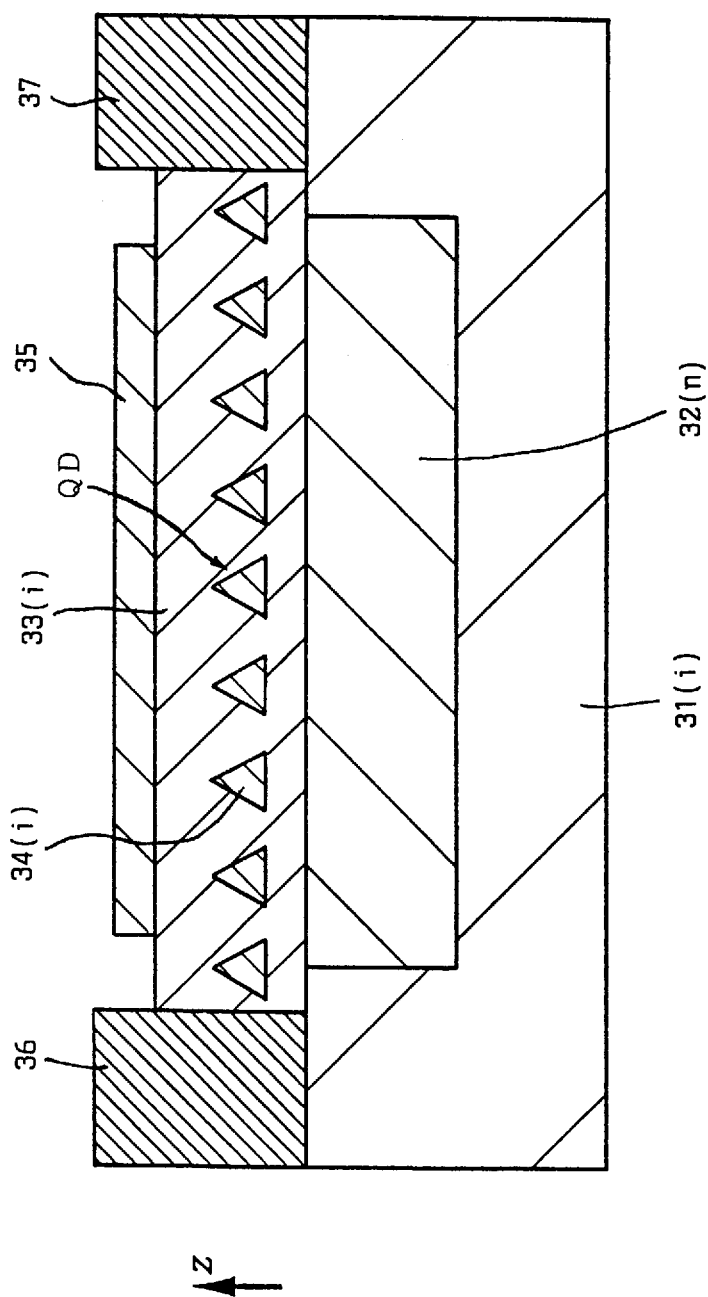
FIG. 22 is a cross-sectional view of a field effect transistor according to a fourth embodiment of the invention.

FIG. 22 shows a field effect transistor taken as the fourth embodiment.

As shown in FIG. 22, the field effect transistor according to the fourth embodiment comprises a semi-insulating GaAs substrate 31, and an n-type GaAs layer 32 as an electrode embedded in the semi-insulating GaAs substrate 31. Formed on the semi-insulating GaAs substrate 31 and the n-type GaAs layer 32 is an i-type $Al_yGa_{1-y}As$ layer 33 behaving as a channel region. Similarly to the second embodiment, a plurality of i-type GaAs layers 34 as quantum wells, each having a tetrahedral geometry, for example, are embedded in the i-type $Al_yGa_{1-y}As$ layer 33 in a predetermined two-dimensional arrangement on the x-y plane. The structure with each i-type GaAs layer 34 as a quantum well surrounded by the i-type $Al_yGa_{1-y}As$ layer 33 makes each quantum dot QD with the $Al_yGa_{1-y}As$/GaAs heterojunction, and a plurality of such quantum dots QD in a two-dimensional arrangement on the x-y plane make up a two-dimensional quantum dots array. Further provided on the i-type $Al_yGa_{1-y}As$ layer 33 is a gate electrode 35 made of a conductor such as metals. Also provided at opposite ends of the i-type $Al_yGa_{1-y}As$ layer 33 are a source electrode 36 and a drain electrode 37, respectively, made of a conductor such as metals.

Explained below is the principle of operation of the field effect transistor having the above-described structure according to the fourth embodiment. In this case, the source electrode 36 is connected to ground and a predetermined positive voltage is applied to the drain electrode 37. The n-type GaAs layer 32 used as the electrode is connected to ground.

When an external electric field in the positive direction of the z-axis is applied to the i-type $Al_yGa_{1-y}As$ layer 33 as a channel region by applying a negative voltage to the gate electrode 35, similarly to the second embodiment, electrons in each quantum dot QD embedded in the i-type $Al_yGa_{1-y}As$ layer 33 as a channel region are pulled to a lower portion of the quantum dot QD in receipt of a force in the negative direction of the z-axis. As a result, the distance between adjacent quantum dots QD decreases effectively, and the width of the barrier between adjacent dots QD hence decreases effectively. Therefore, electrons become easy to move between adjacent quantum dots QD by tunnelling, and the transfer energy T increases. In this state, it is easy for a drain current to flow between the source electrode 36 and the drain electrode 37.

In contrast, when the direction of external electric field is opposite, that is, the negative direction of the z-axis, electrons in each quantum dot QD receive a force in the positive direction of the z-axis, and are forced to move to an upper portion of the quantum dot QD, that is, to the vertex of the tetrahedron. At this time, the distance between adjacent quantum dots QD increases effectively, and the width of the barrier between adjacent quantum dots QD hence increases effectively. Therefore, electrons become difficult to move between adjacent quantum dots QD by tunnelling, and the transfer energy T decreases. In this state, it is difficult for a drain current to flow between the source electrode 36 and the drain electrode 37.

In the above-described manner, the transfer energy T between quantum dots QD can be modulated efficiently by applying an external electric field in the z-axis direction to the gate electrode 35. It is therefore possible to efficiently modulate the drain current flowing between the source electrode 36 and the drain electrode 37 and to realize transistor action.

Explained below is a process for manufacturing the field effect transistor having the above-described construction according to the fourth embodiment.

An n-type impurity is first selectively doped into the semi-insulating GaAs substrate 31 by, for example, ion implantation, to make the n-type GaAs layer 32. Subsequently, the i-type $Al_yGa_{1-y}As$ layer 33 is epitaxially grown on the semi-insulating GaAs substrate 31 and the n-type GaAs layer 32 by, for example, MOCVD, and then patterned into the form of the channel region by etching. After that, the gate electrode 35 is formed on the i-type $Al_yGa_{1-y}As$ layer 33, and the source electrode 36 and the drain electrode 37 are formed at opposite ends of the i-type $Al_yGa_{1-y}As$ layer 33. Thus an intended field effect transistor is completed.

As described above, by embedding quantum dots array on an x-y plane in the i-type $Al_yGa_{1-y}As$ layer 33 behaving as the channel region, the fourth embodiment realizes an efficient modulation of the drain current responsive to an external electric field applied in the z-axis direction orthogonal to the plane of arrangement of the quantum dots QD constituting the quantum dots array.

Figure 23A:
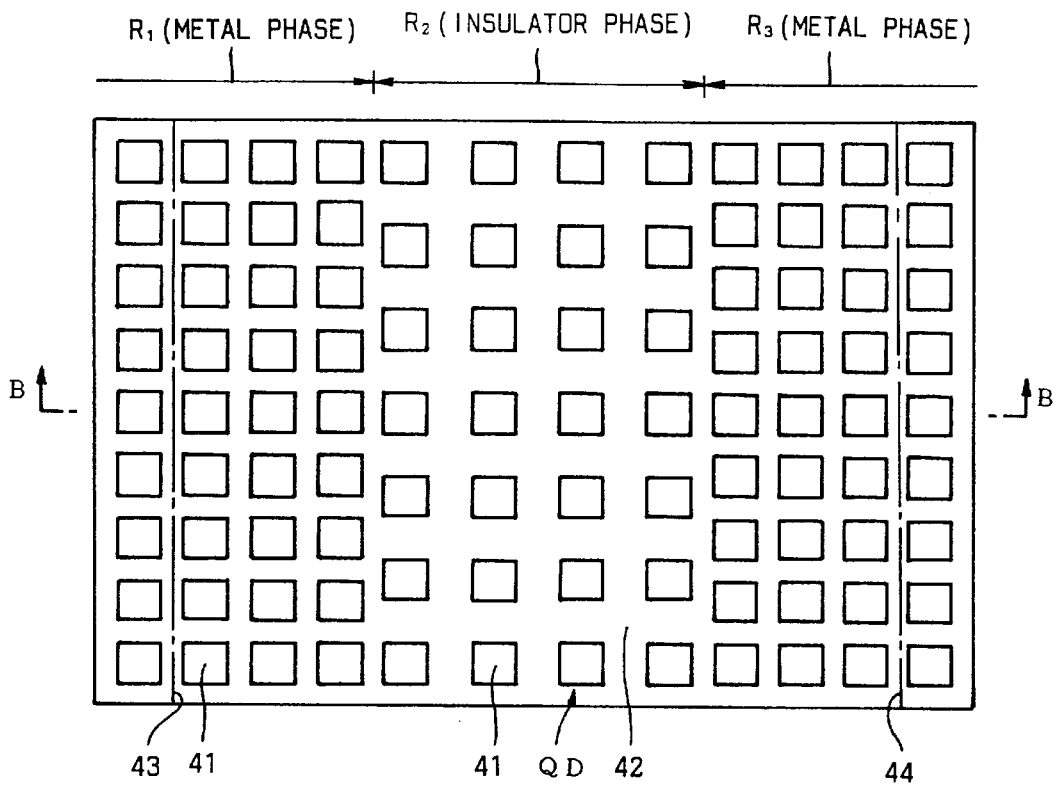
FIG. 23A is a plan view of a quantum device according to a fifth embodiment of the invention.
Figure 23B:
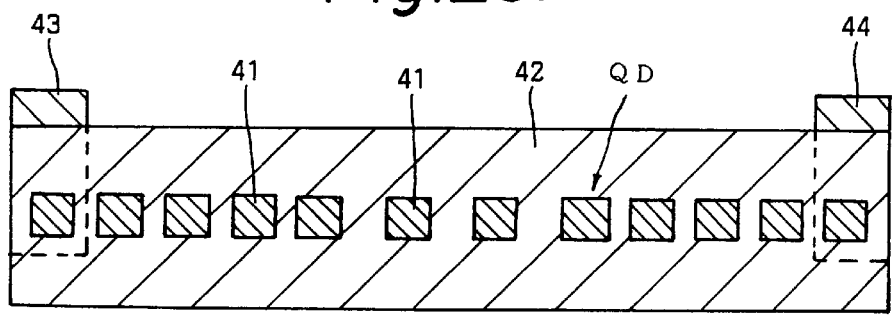
FIG. 23B is a cross-sectional view of the quantum device according to the fifth embodiment, taken along the B—B line of FIG. 23A.
Figure 23C:
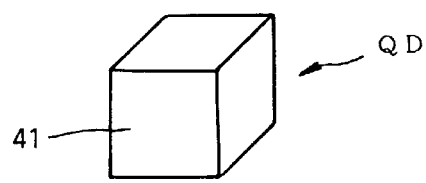
FIG. 23C is a perspective view showing a single quantum dot of the quantum device according to the fifth embodiment.

FIGS. 23A to 23C show a quantum device according to a fifth embodiment of the invention, in which FIG. 23A is a plan view, FIG. 23B is a cross-sectional view taken along the B—B line of FIG. 23A, and FIG. 23C is a perspective view of a single quantum dot in the same quantum device.

As shown in FIGS. 23A to 23C, the quantum device according to the fifth embodiment includes three regions $R_1$, $R_2$ and $R_3$ in a sequential close alignment, each of the regions comprising a quantum dots array including a plurality of quantum dots QD in an adjacent two-dimensional alignment on a common plane, each of the quantum dots QD being made of GaAs/AlGaAs heterojunction of a box-shaped GaAs layer 41 as a quantum well and an AlGaAs layer 42 surrounding the GaAs layer 41 to behave as a barrier layer. In this case, distances between the quantum dots QD in the quantum dots arrays in the regions $R_1$ and $R_3$ are chosen to be small enough for the regions $R_1$ and $R_3$ to exhibit a metallic phase. More specifically, if the size of each quantum dot QD is around 10 nm, for example, the distance between quantum dots QD is around 5 nm. In contrast, the distance between quantum dots QD in the quantum dots array in the region $R_2$ is chosen to be large enough for the region $R_2$ to exhibit an insulator phase.

Introduced from the regions $R_1$ and $R_3$ are electrodes 43 and 44 in the form of metal layers. In this case, these electrodes 43 and 44 are in ohmic contact with the quantum dots arrays in the regions $R_1$ and $R_3$ via alloy layers made from their own metal and underlying AlGaAs and GaAs (portions surrounded by broken lines in FIG. 23B).

The quantum device according to the fifth embodiment represents a tunnel diode of the structure with the insulator-phase region $R_2$ sandwiched by the metallic-phase regions $R_1$ and $R_3$. In this tunnel diode, the insulative-phase region $R_2$ behaves as a tunnelling barrier of electrons in a current flowing between the electrodes 43 and 44.

The quantum device according to the fifth embodiment may be fabricated in the following process. First epitaxially grown on a substrate (for example, a semi-insulating GaAs substrate, not shown) are an AlGaAs layer, GaAs layer and AlGaAs layer of predetermined thicknesses in sequence by, for example, metallorganic chemical vapor deposition (MOCVD). After that, a resist pattern is formed on the upper-most AlGaAs layer to protect its selective portions for quantum dots QD by, for example, electron beam lithography. By using the resist pattern as a mask, etching is done in the direction perpendicular to the substrate surface by, for example, reactive ion etching (RIE) to sequentially remove selective portions of the upper-most AlGaAs layer and GaAs layer. As a result, these AlGaAs layer and the GaAs layer are patterned into quadrangular prisms. Then, after removing the resist pattern, an AlGaAs layer is epitaxially grown on the entire surface by, for example, MOCVD to fill gaps between quadrangular-prismatic GaAs layers and AlGaAs layers. After that, electrodes 43 and 44 made of a metal are formed by a method such as lift-off, they are annealed to alloy them with the underlying AlGaAs layer and GaAs layer. Thus an intended quantum device is completed.

Since the quantum device according to the fifth embodiment utilizes a many-body tunneling effect via the Hubbard gap of the quantum dots array in the insulator-phase region $R_2$, it does not require a strict uniformity in fabrication of the quantum dots QD, and its fabrication and incorporation into an IC are relatively easy.

Figure 24A:
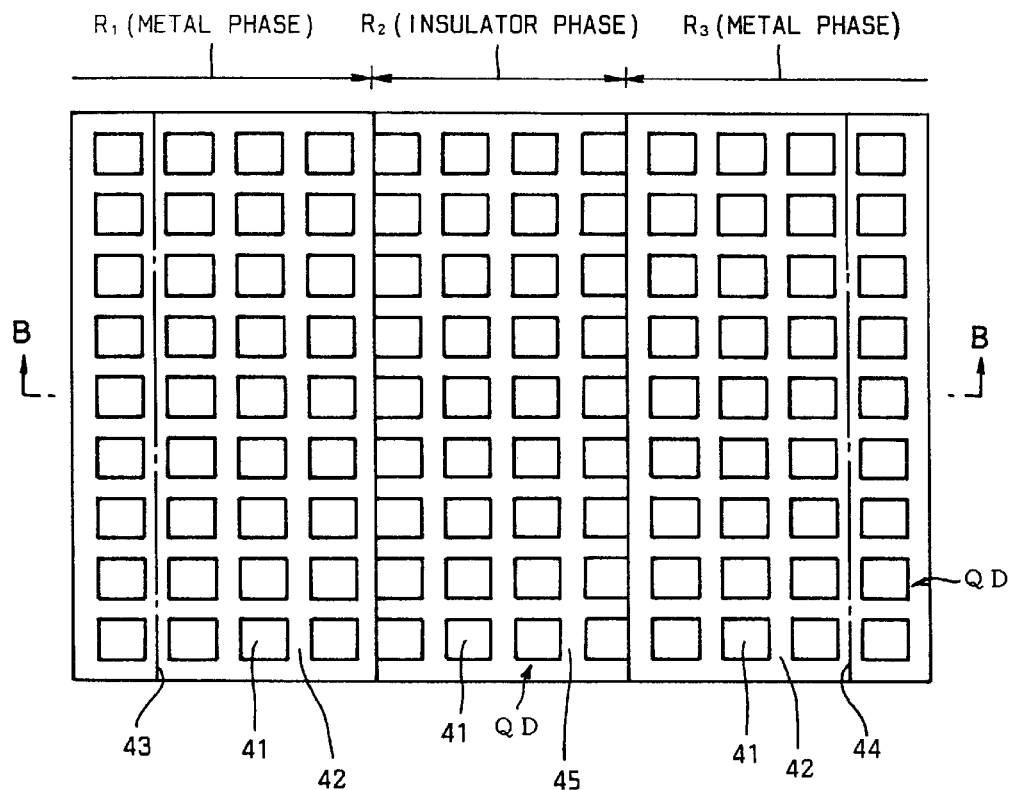
FIG. 24A is a plan view of a quantum device according to a sixth embodiment of the invention.
Figure 24B:
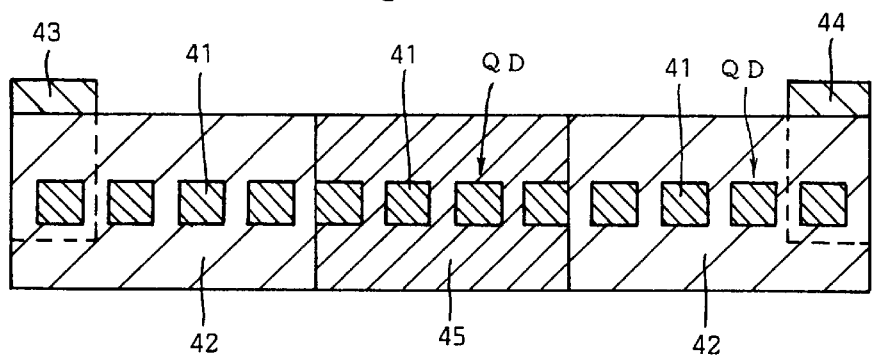
FIG. 24B is a cross-sectional view of the quantum device according to the sixth embodiment, taken along the B—B line of FIG. 24A.
Figure 24C:
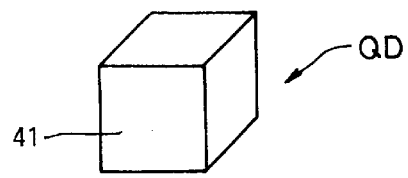
FIG. 24C is a perspective view of a single quantum dot of the quantum device according to the sixth embodiment.

FIGS. 24A to 24C show a quantum device according to a sixth embodiment of the invention, in which FIG. 24A is a plan view, FIG. 24B is a cross-sectional view taken along the B—B line of FIG. 24A, and FIG. 24C is a perspective view of a single quantum dot.

As shown in FIGS. 24A to 24C, the quantum device according to the sixth embodiment includes regions $R_1$, $R_2$ and $R_3$ in a sequential close alignment. The region $R_1$ comprises a quantum dots array including a plurality of quantum dots QD in an adjacent two-dimensional alignment on a common plane, each of the quantum dots QD being made of GaAs/AlGaAs heterojunction of a box-shaped GaAs layer 41 as a quantum well and an AlGaAs layer 42 surrounding the GaAs layer 41 to behave as a barrier layer. The region $R_2$ comprises a quantum dots array including a plurality of quantum dots QD in an adjacent two-dimensional alignment on a common plane, each of the quantum dots QD being made of GaAs/AlAs heterojunction of a box-shaped GaAs layer 41 as a quantum well and an AlAs layer 45 surrounding the GaAs layer 41 to behave as a barrier layer. The region $R_3$ comprises a quantum dots array including a plurality of quantum dots QD in an adjacent two-dimensional alignment on a common plane, each of the quantum dots QD being made of GaAs/AlGaAs heterojunction of a box-shaped GaAs layer 41 as a quantum well and an AlGaAs layer 42 surrounding the GaAs layer 41 to behave as a barrier layer as in the region $R_1$. In this case, distances between the quantum dots QD in the quantum dots arrays in the regions $R_1$ and $R_3$ are chosen to be small enough for the regions $R_1$ and $R_3$ to exhibit a metal phase. More specifically, if the size of each quantum dot QD is around 10 nm, for example, the distance between quantum dots QD is around 5 nm. Also the distance between the quantum dots QD in the quantum dots array in the region $R_2$ is the same as that in the regions $R_1$ and $R_3$; however, since each quantum dot QD of the quantum dots array in the region $R_2$ is made of the GaAs/AlAs heterojunction, which makes the barrier height between quantum dots QD in the region $R_2$ to be larger than that of quantum dots QD made of GaAs/AlGaAs heterojunction, the region $R_2$ exhibits an insulator phase.

As in the fifth embodiment, electrodes 43 and 44 are introduced from the regions $R_1$ and $R_3$. These electrodes 43 and 44 are brought into ohmic contact with the quantum dots arrays in the regions $R_1$ and $R_3$.

The quantum device according to the sixth embodiment, like that according to the fifth embodiment, represents a tunnel diode of the structure with the insulator-phase region $R_2$ sandwiched by the metal-phase regions $R_1$ and $R_3$. In this tunnel diode, the insulator-phase region $R_2$ behaves as a tunnelling barrier of electrons in a current flowing between the electrodes 43 and 44.

The quantum device according to the sixth embodiment may be fabricated in the following process. First epitaxially grown on a substrate (for example, a semi-insulating GaAs substrate, not shown) are an AlGaAs layer, GaAs layer and AlGaAs layer of predetermined thicknesses in sequence by, for example, MOCVD. After that, a resist pattern is formed on the upper-most AlGaAs layer to protect its selective portions for quantum dots QD by, for example, electron beam lithography. By using the resist pattern as a mask, etching is done in the direction perpendicular to the substrate surface by, for example, to sequentially remove selective portions of the upper-most AlGaAs layer and GaAs layer. As a result, these AlGaAs layer and the GaAs layer are patterned into quadrangular prisms. Then, after removing the resist pattern, an AlGaAs layer is epitaxially grown on the entire surface by, for example, MOCVD to fill gaps between quadrangular-prismatic GaAs layers and AlGaAs layers. After that, a mask in the form of a $SiO_2$ film, for example, is provided on selective portions of the upper-most AlGaAs layer in the regions $R_1$ and $R_3$, and the exposed portion of the AlGaAs layer, GaAs layer and AlGaAs layer is etched off by using the mask. After that, AlAs, GaAs and AlAs layers are sequentially epitaxially grown up to given thicknesses by, for example, MOCVD. These AlAs, GaAs and AlAs layers epitaxially grow only in the portion corresponding to the region $R_2$ because the mask serves as a growth mask. Then, after a resist pattern is made on selected portions of the upper-most AlAs layer corresponding to quantum dots QD in the region $R_2$ by, for example, electron beam lithography, the upper-most AlAs and GaAs layers are sequentially etched off in the direction perpendicular to the substrate surface by, for example, RIE using the resist pattern as a mask. As a result, these GaAs and AlAs layers are patterned into quadrangular prisms. Gaps between the quadrangular prisms are sequentially filled with an AlAs layer. After electrodes 43 and 44 made of a metal are formed by a method such as lift-off, they are annealed to alloy them with the underlying AlGaAs layer and GaAs layer. Thus an intended quantum device is completed.

Since the quantum device according to the sixth embodiment utilizes a many-body tunneling effect via the Hubbard gap of the quantum dots array in the insulator-phase region $R_2$, like that by the fifth embodiment, it does not require a strict uniformity in fabrication of the quantum dots QD, and its fabrication and incorporation into an IC are relatively easy.

FIG. 25 is a plan view showing a quantum device according to a seventh embodiment of the invention.

As shown in FIG. 25, the quantum device according to the seventh embodiment includes five regions $R_1$, $R_2$, $R_3$, $R_4$ and $R_5$ in a sequential alignment, each region comprising a quantum dots array including a close two-dimensional alignment of quantum dots QD on a common plane, each quantum dot QD being made of GaAs/AlGaAs heterojunction in which a box-shaped GaAs layer 41 as a quantum well is surrounded by an AlGaAs layer 42 as a barrier layer. In this case, distances between quantum dots constituting the quantum dots arrays in the regions $R_1$, $R_3$ and $R_5$ are chosen to be small enough for the regions $R_1$, $R_2$ and $R_3$ to exhibit a metal phase. More specifically, if the size of each quantum dot QD is around 10 nm, the distance between the quantum dots QD may be around 5 nm. In contrast, distances between quantum dots QD constituting the quantum dots arrays in the regions $R_2$ and $R_4$ are chosen to be large enough for the regions $R_2$ and $R_4$ to exhibit an insulator phase.

As in the fifth embodiment, electrodes 43 and 44 are introduced from the regions $R_1$. and $R_5$. These electrodes 43 and 44 are brought into ohmic contact with the regions $R_1$ and $R_5$, respectively.

The quantum device according to the seventh embodiment represents a resonant tunnel diode of the structure with two arrangements: one comprising the insulator-phase region $R_2$ sandwiched by the metal-phase regions $R_1$ and $R_3$ and the other comprising the insulator-phase region $R_4$ sandwiched by the metal-phase regions $R_3$ and $R_5$. In this resonant tunnel diode, the regions $R_2$, $R_3$ and $R_4$ behave as a resonant tunnelling barrier of electrons in a current flowing between the electrodes 43 and 44.

The process for manufacturing the quantum device according to the seventh embodiment is the same as that of the fifth embodiment, and hence omitted from explanation.

Since the quantum device according to the seventh embodiment utilizes a many-body tunneling effect via the Hubbard gaps of the quantum dots arrays in the insulator-phase regions $R_2$ and $R_4$, it does not require a strict uniformity in fabrication of the quantum dots QD, and its fabrication and incorporation into an IC are relatively easy.

Figure 26:
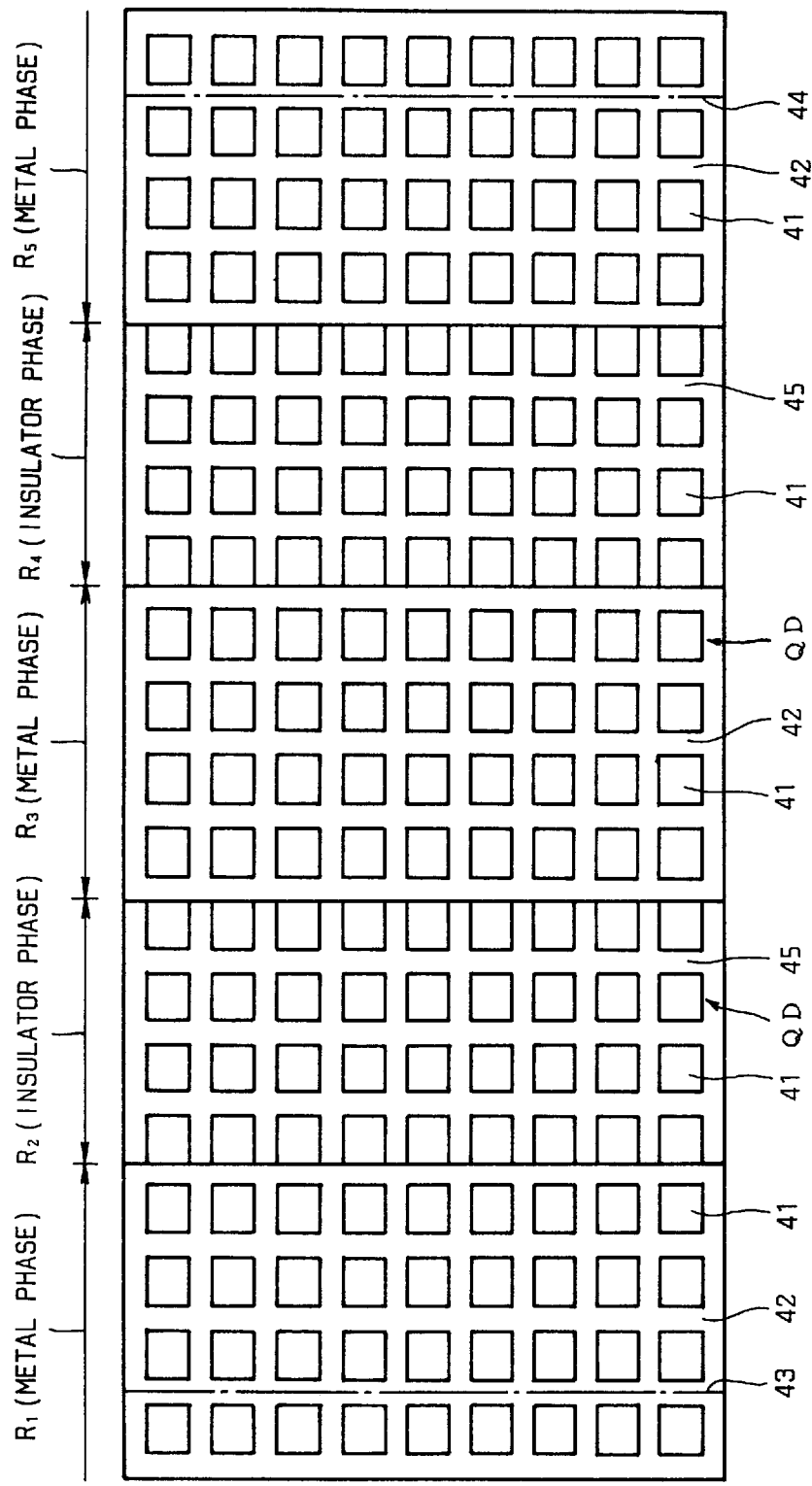
FIG. 26 is a plan view of a quantum device according to an eighth embodiment of the invention.

FIG. 26 is a plan view showing a quantum device according to an eighth embodiment of the invention.

As shown in FIG. 26, the quantum device according to the eighth embodiment includes regions $R_1$, $R_2$, $R_3$, $R_4$ and $R_5$ in a sequential close alignment. The region $R_1$ comprises a quantum dots array including a plurality of quantum dots QD in an adjacent two-dimensional alignment on a common plane, each of the quantum dots QD being made of GaAs/AlGaAs heterojunction of a box-shaped GaAs layer 41 as a quantum well and an AlGaAs layer 42 surrounding the GaAs layer 41 to behave as a barrier layer. The region $R_2$ comprises a quantum dots array including a plurality of quantum dots QD in an adjacent two-dimensional alignment on a common plane, each of the quantum dots QD being made of GaAs/AlGaAs heterojunction of a box-shaped GaAs layer 41 as a quantum well and an AlAs layer 45 surrounding the GaAs layer 41 to behave as a barrier layer. The region $R_3$ comprises a quantum dots array including a plurality of quantum dots QD in an adjacent two-dimensional alignment on a common plane, each of the quantum dots QD being made of GaAs/AlGaAs heterojunction of a box-shaped GaAs layer 41 as a quantum well and an AlGaAs layer 42 surrounding the GaAs layer 41 to behave as a barrier layer as in the region $R_1$. The region $R_4$ comprises a quantum dots array including a plurality of quantum dots QD in an adjacent two-dimensional alignment on a common plane, each of the quantum dots QD being made of GaAs/AlAs heterojunction of a box-shaped GaAs layer 41 as a quantum well and an AlAs layer 45 surrounding the GaAs layer 41 to behave as a barrier layer as in the region $R_2$. The region $R_5$ comprises a quantum dots array including a plurality of quantum dots QD in an adjacent two-dimensional alignment on a common plane, each of the quantum dots QD being made of GaAs/AlGaAs heterojunction of a box-shaped GaAs layer 41 as a quantum well and an AlGaAs layer 42 surrounding the GaAs layer 41 to behave as a barrier layer as in the regions $R_1$ and $R_3$. In this case, distances between the quantum dots QD in the quantum dots arrays in the regions $R_1$, $R_3$ and $R_5$ are chosen to be small enough for the regions $R_1$, $R_3$ and $R_5$ to exhibit a metal phase. More specifically, if the size of each quantum dot QD is around 10 nm, for example, the distance between quantum dots QD is around 5 nm. Also the distances between the quantum dots QD in the quantum dots arrays in the regions $R_2$ and $R_4$ are the same as those in the regions $R_1$, $R_3$ and $R_5$; however, since each quantum dot QD of the quantum dots arrays in the regions $R_2$ and $R_4$ is made of the GaAs/AlAs heterojunction, which makes the barrier height between quantum dots QD in the regions $R_2$ and $R_4$ to be larger than that of quantum dots QD made of GaAs/AlGaAs heterojunction, the regions $R_2$ and $R_4$ exhibit an insulator phase.

As in the sixth embodiment, electrodes 43 and 44 are introduced from the regions $R_1$ and $R_5$. These electrodes 43 and 44 are brought into ohmic contact with the quantum dots arrays in the regions $R_1$ and $R_5$, respectively.

The quantum device according to the eighth embodiment, like that by the seventh embodiment, represents a resonant tunnel diode of the structure with two arrangements: one comprising the insulator phase region $R_2$ sandwiched by the metal-phase regions $R_1$ and $R_3$ and the other comprising the insulator-phase region $R_4$ sandwiched by the metal-phase regions $R_3$ and $R_5$. In this resonant tunnel diode, the regions $R_2$, $R_3$ and $R_4$ behave as a resonant tunnelling barrier of electrons in a current flowing between the electrodes 43 and 44.

The process for manufacturing the quantum device according to the eighth embodiment is the same as that of the sixth embodiment, and hence omitted from explanation.

Since the quantum device according to the eighth embodiment, like that by the seventh embodiment, utilizes a many-body tunneling effect via the Hubbard gaps of the quantum dots arrays in the insulator-phase regions $R_2$ and $R_4$, it does not require a strict uniformity in fabrication of the quantum dots QD, and its fabrication and incorporation into an IC are relatively easy.

Figure 27:
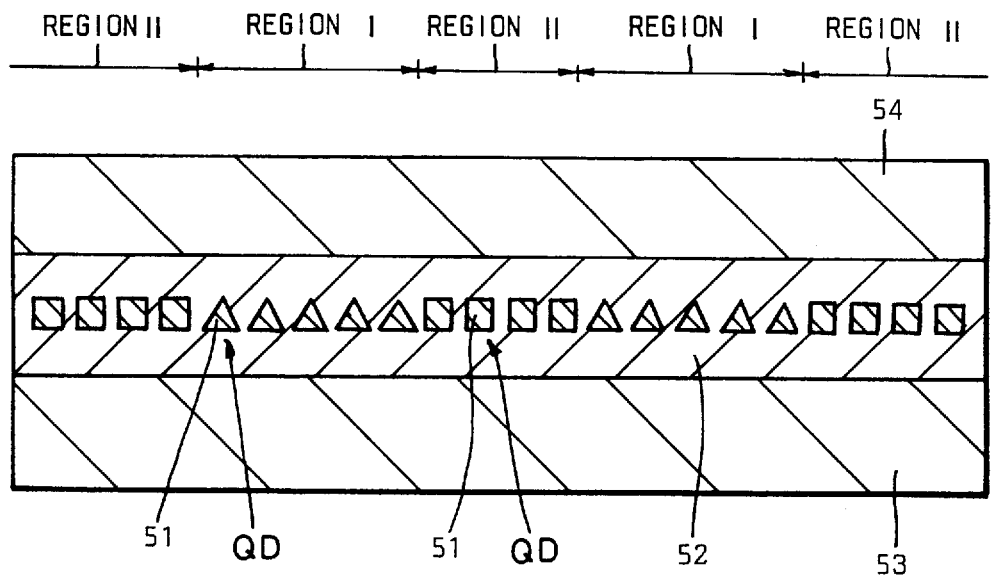
FIG. 27 is a cross-sectional view of a quantum device according to a ninth embodiment of the invention.
Figure 28:
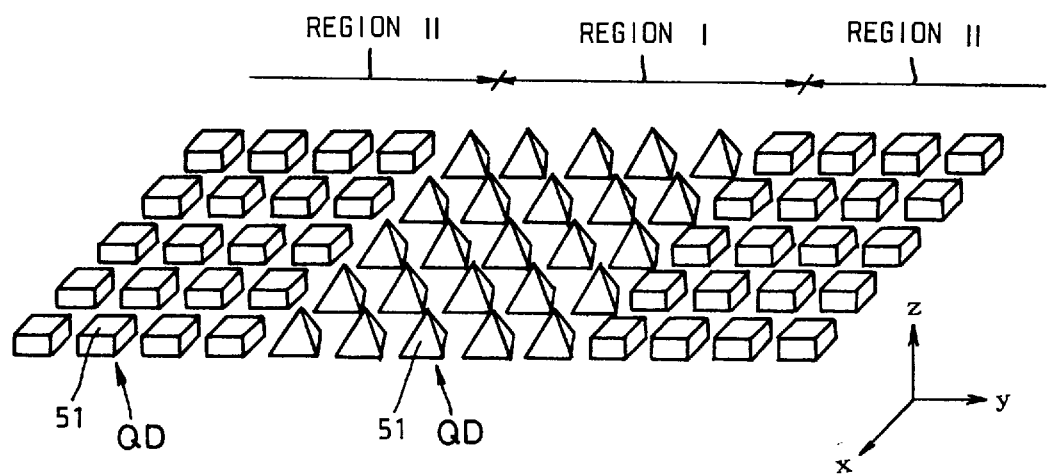
FIG. 28 is a perspective view showing a part of a region comprising a quantum dots array in the quantum device according to the ninth embodiment.

FIG. 27 is a cross-sectional view showing a quantum device according to a ninth embodiment of the invention, and FIG. 28 is a perspective view showing a part of a region comprising a quantum dots array in the quantum device according to the ninth embodiment.

As shown in FIGS. 27 and 28, the quantum device according to the ninth embodiment has a multi-junctional structure including regions I and regions II in an alternating, continuous alignment. The regions I each comprise a quantum dots array including quantum dots QD in an adjacent two-dimensional arrangement on a common plane, that is, an x-y plane, each of the quantum dots QD being made of GaAs/AlGaAs heterojunction of a tetrahedral GaAs layer 51 as a quantum well and an AlGaAs layer 52 surrounding the GaAs layer 51 to behave as a barrier layer. The regions II each comprise a quantum dots array including quantum dots QD in an adjacent two-dimensional alignment on the x-y plane, each of the quantum dots QD being made of GaAs/AlGaAs heterojunction of a quadrangular-prismatic GaAs layer 51 as a quantum well and an AlGaAs layer 52 surrounding the GaAs layer 51 to behave as a barrier layer. Electrodes 53 and 54 are formed to sandwich these regions I and II from the top and bottom sides. The quantum device is shown in FIG. 27 as having two regions I and three regions II.

In this case, each tetrahedral quantum dot QD of the regions I has a geometrical asymmetry in the z-axis direction orthogonal to the plane of the arrangement, that is, the x-y plane. Cross-sectional area of each quantum dots QD monotonously decreases in the positive direction of the z-axis, when taken along planes parallel to the x-y plane. Distance between adjacent quantum dots QD also increases monotonously in the positive direction of the z-axis. In contrast, each quadrangular-prismatic quantum dot QD of the regions II has a symmetrical shape in the z-axis direction, and does not have such a geometrical asymmetry.

The distance between quantum dots QD of the quantum dots arrays in the regions I and II are chosen to be small enough for both regions I and II to exhibit a metallic phase when no external electric field is applied in the z-axis direction. More specifically, if the size of each quantum dot QD is around 10 nm, for example, the distance between quantum dots QD is around 5 nm.

Next explained is the principle of operation of the quantum device having the above-described structure according to the ninth embodiment.

Figure 29:
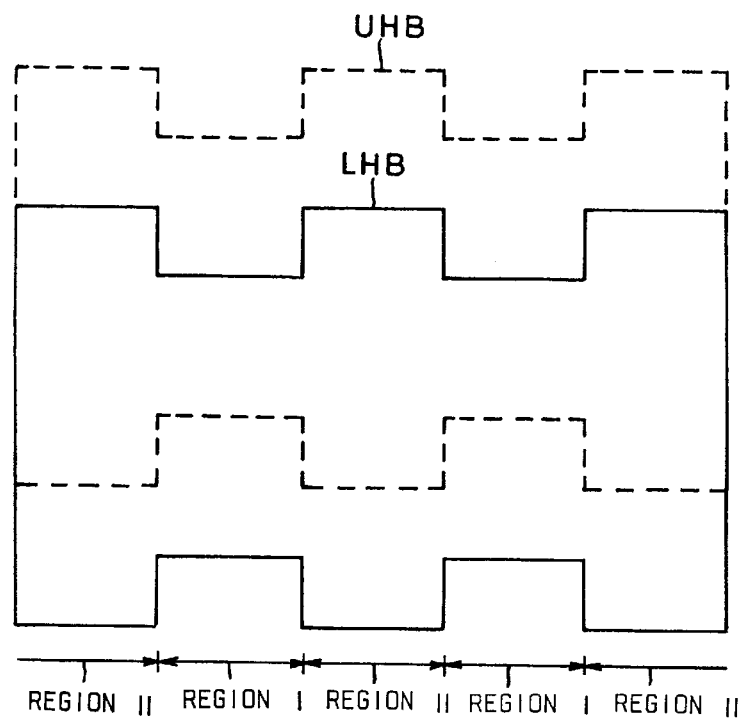
FIG. 29 is an energy band diagram of the quantum device according to the ninth embodiment, with no external electric field applied in the z-axis direction.

As referred to above, when no external electric field is applied in the z-axis direction, both of the regions I and II represent a metal phase with no external electric field applied in the z-axis direction, and its corresponding energy band diagram is as shown in FIG. 29.

Figure 30:
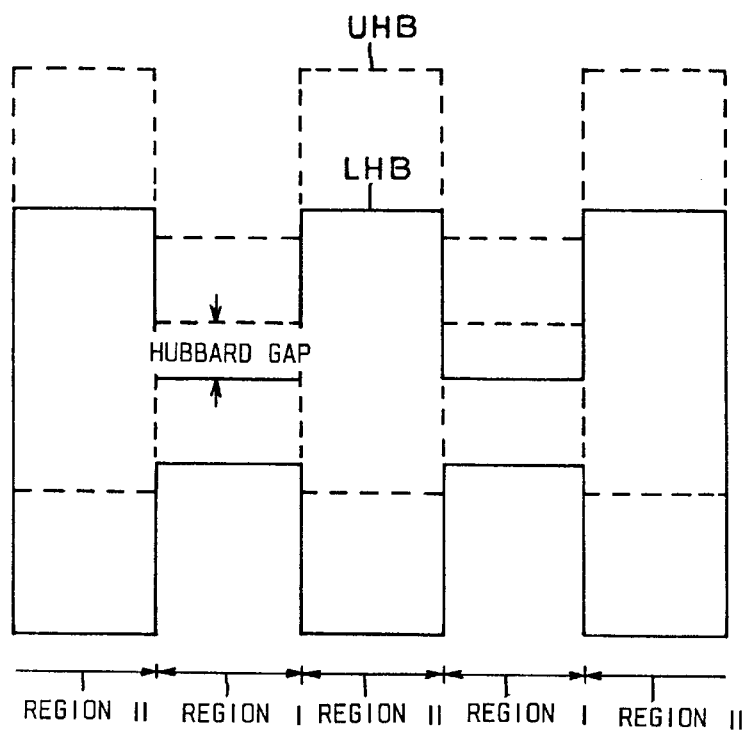
FIG. 30 is an energy band diagram of the quantum device according to the ninth embodiment, with an external electric field applied in the z-axis direction.

When lowering the potential of the electrode 53 than the potential of the other electrode 54, for example, by connecting the electrode 53 to ground and applying a positive voltage to the electrode 54, to apply a uniform external electric field in the negative direction of the z-axis, electrons in respective tetrahedral quantum dots QD of the quantum dots arrays in the regions I receive a force in the positive direction of the z-axis, and are forced to move to upper portions of the quantum dots QD, i.e. to the vertexes of the tetrahedrons. In other words, distribution of wave functions of electrons in the quantum dots QD is deflected to the positive side of the z-axis. Then the distance between adjacent quantum dots QD increases effectively. As a result, the regions I represent an insulator phase because of a Mott metal-insulator transition due to a Mott-Stark effect. Electrons in respective quadrangular-prismatic quantum dots QD forming the quantum dots arrays in the regions II also receive a force in the positive direction of the z-axis, and are forced to move to upper portions; however, the regions II maintain their metal phase because no change occurs in distance between adjacent quantum dots QD. When no external electric field is applied in the negative direction of the z-axis, the energy band diagram of the quantum device according to the ninth embodiment appears as shown in FIG. 30 where the Hubbard gap of each insulator-phase region II exists between metal-phase regions II. In this state, a many-body quantum-mechanical tunneling effect via the Hubbard gap, i.e. a Hubbard gap tunnelling, is observed.

Figure 31A:
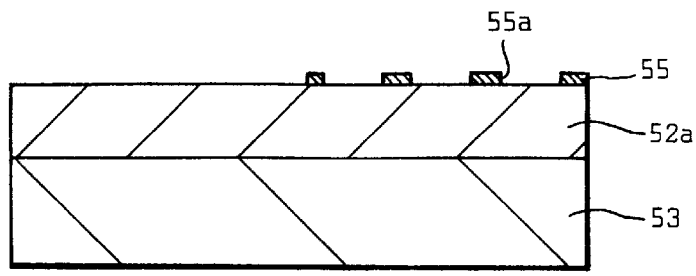
FIGS. 31A to 31D are cross-sectional views for explaining a manufacturing process of the quantum device according to the ninth embodiment.
Figure 31B:
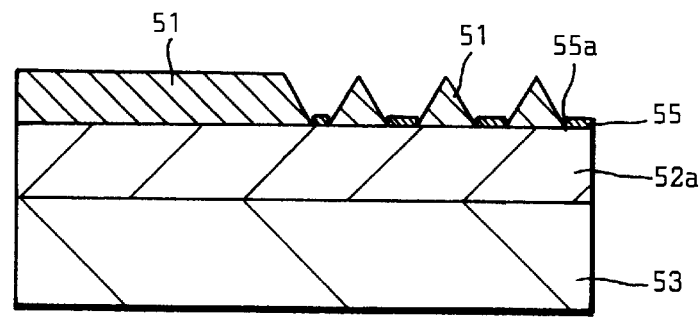
Figure 31C:
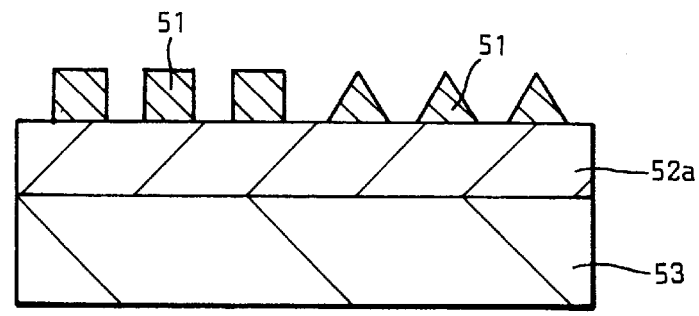
Figure 31D:
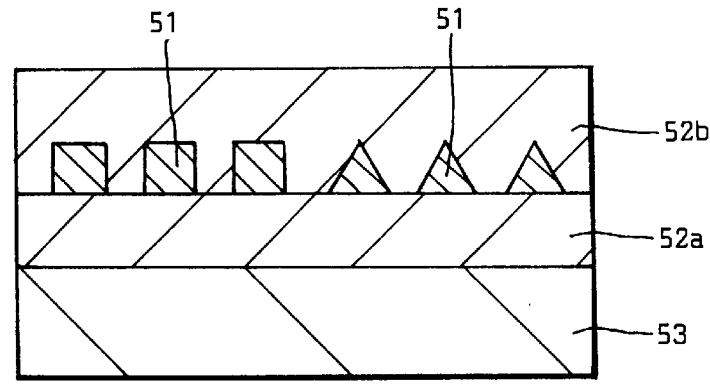

The quantum device having the above-described structure according to the ninth embodiment may be manufactured, for example, by the following process. First prepared is an n-type GaAs substrate as the electrode 53, as shown in FIG. 31A, and an AlGaAs layer 52a with a predetermined thickness is epitaxially grown on the n-type GaAs substrate as the electrode 53 by, for example, MOCVD. After that, a SiO$_2$ film 55, for example, is formed on the AlGaAs layer 52a by, for example, CVD, and then patterned by etching to remove selective portions of the SiO$_2$ film 55 corresponding to the regions II and to make two-dimensional arrangements of regular-triangular openings 55a in the remainder portions of the SiO$_2$ film 55 corresponding to the regions I. After that, GaAs is epitaxially grown on the entire surface by MOCVD again. As a result, as shown in FIG. 31B, GaAs layers 51 in the form of tetrahedrons epitaxially grow on selective portions of the AlGaAs layer 52a in the openings 55a of the SiO$_2$ film 55 in the regions I, and a continuous GaAs layer 51 of a uniform thickness epitaxially grows on each portion of the AlGaAs layer 52a corresponding to each region II. Then the SiO$_2$ film 55 is then etched off. After that, as shown in FIG. 31C, the GaAs layer 51 in the portion corresponding to the region II is patterned into the shape of quantum wells by etching. Next, as shown in FIG. 31D, an AlGaAs layer 52b is epitaxially grown on the entire surface by MOCVD again. After that, the electrode 54 comprising a metal film, for example, is formed on the AlGaAs layer 52b by, for example, vacuum evaporation. Thus an intended quantum device as shown in FIGS. 27 and 28 is completed.

As described above, the quantum device according to the ninth embodiment uses the alternating, close alignment of regions I each comprising a quantum dots array with an x-y-plane arrangement of tetrahedral quantum dots QD with a geometrical asymmetry in the z-axis direction; and regions II each comprising a quantum dots array with an x-y-plane arrangement of quadrangular-prismatic quantum dots QD having no geometrical asymmetry in the z-axis direction, so that both regions I and II represent a metal phase with no external electric field applied in the z-axis direction, but the regions I represent an insulator phase with an external electric field applied in the negative direction of the z-axis, by occurrence of a Mott metal-insulator transition due to a Mott-Stark effect. That is, the quantum device according to the ninth embodiment permits governing the existence and the absence of tunnelling barriers in the regions I by applying or not applying an external electric field in the z-axis direction. When a tunnelling barrier exists in the region I, the quantum device according to the ninth embodiment may be used as a tunnelling effect device. In this case, since a many-body quantum-mechanical tunneling effect via the Hubbard gap of the insulator-phase region I is utilized, the device does not require a strict uniformity in fabrication of quantum dots QD, and its fabrication and incorporation into an IC are relatively easy.

Figure 32:
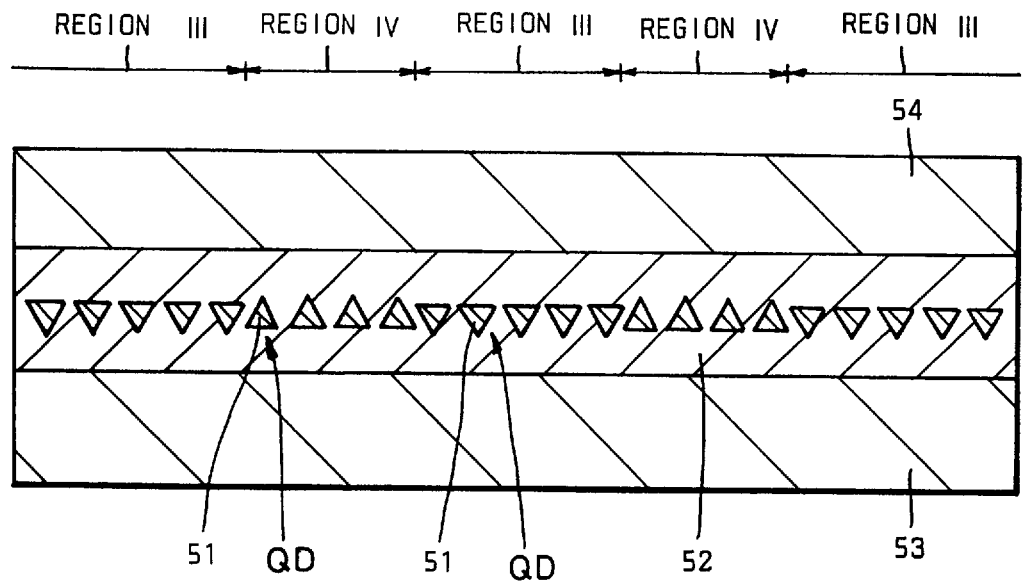
FIG. 32 is a cross-sectional view of a quantum device according to a tenth embodiment of the invention.
Figure 33:
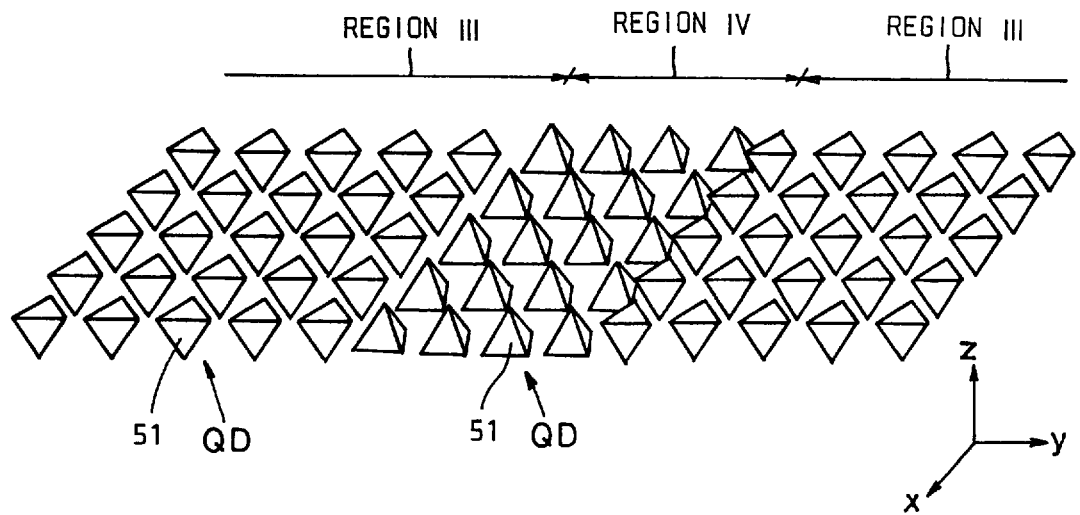
FIG. 33 is a perspective view showing a part of a region comprising a quantum dots array in the quantum device according to the tenth embodiment.

FIG. 32 is a cross-sectional view showing a quantum device according to a tenth embodiment of the invention, and FIG. 33 is a perspective view showing a part of a region comprising a quantum dots array in the quantum device.

As shown in FIGS. 32 and 33, the quantum device according to the tenth embodiment has a multi-junctional structure including regions III and regions IV in an alternating, continuous alignment. The regions III each comprise a quantum dots array including quantum dots QD in an adjacent two-dimensional arrangement on a common plane, that is, an x-y plane, each of the quantum dots QD being made of GaAs/AlGaAs heterojunction of a tetrahedral GaAs layer 51 as a quantum well and an AlGaAs layer 52 surrounding the GaAs layer 51 to behave as a barrier layer. The regions IV each comprise a quantum dots array including quantum dots QD in an adjacent two-dimensional alignment on the x-y plane, each of the quantum dots QD being made of GaAs/AlGaAs heterojunction of a tetrahedral GaAs layer 51 as a quantum well and an AlGaAs layer 52 surrounding the GaAs layer 51 to behave as a barrier layer. Electrodes 53 and 54 are formed to sandwich these regions III and IV from the top and bottom sides. The quantum device is shown in FIG. 32 as having three regions III and two regions IV.

In this case, each tetrahedral quantum dot QD of any of the regions III and IV has a geometrical asymmetry in the z-axis direction orthogonal to the plane of the arrangement, that is, the x-y plane. However, each tetrahedral quantum dot QD in the regions III is oriented with its vertex pointing the negative direction of the z-axis and its bottom surface opposed to the vertex lying in the positive side of the z-axis.

In contrast, each tetrahedral quantum dot QD in the regions IV is oriented with its vertex pointing the positive direction of the z-axis and its bottom surface opposed to the vertex lying in the negative side of the z-axis. That is, the asymmetry of the quantum dots QD in the regions III and the asymmetry of the quantum dots QD in the regions IV are in a mutually inverse relation.

Cross-sectional area of each quantum dot QD in the regions III monotonously increases in the positive direction of the z-axis, when taken along planes parallel to the x-y plane, and distance between adjacent quantum dots QD monotonously decreases in the positive direction of the z-axis. In contrast, cross-sectional area of each quantum dot QD in the regions IV monotonously decreases in the positive direction of the z-axis, when taken along planes parallel to the x-y plane, and distance between adjacent quantum dots QD monotonously increases in the positive direction of the z-axis.

The distance between quantum dots QD of the quantum dots arrays in the regions III are chosen to be small enough for the regions III to exhibit a metal phase when an external electric field is applied in the negative direction of the z-axis. More specifically, if the size of each quantum dot QD is around 10 nm, for example, the distance between quantum dots QD is around 5 nm. The distance between quantum dots QD of the quantum dots arrays in the regions IV are chosen to be small enough for the regions IV to exhibit a metal phase when an external electric field is applied in the positive direction of the z-axis. More specifically, if the size of each quantum dot QD is around 10 nm, for example, the distance between quantum dots QD is around 5 nm.

Explained below is the principle of operation of the quantum device having the above-described structure according to the tenth embodiment.

Figure 34:
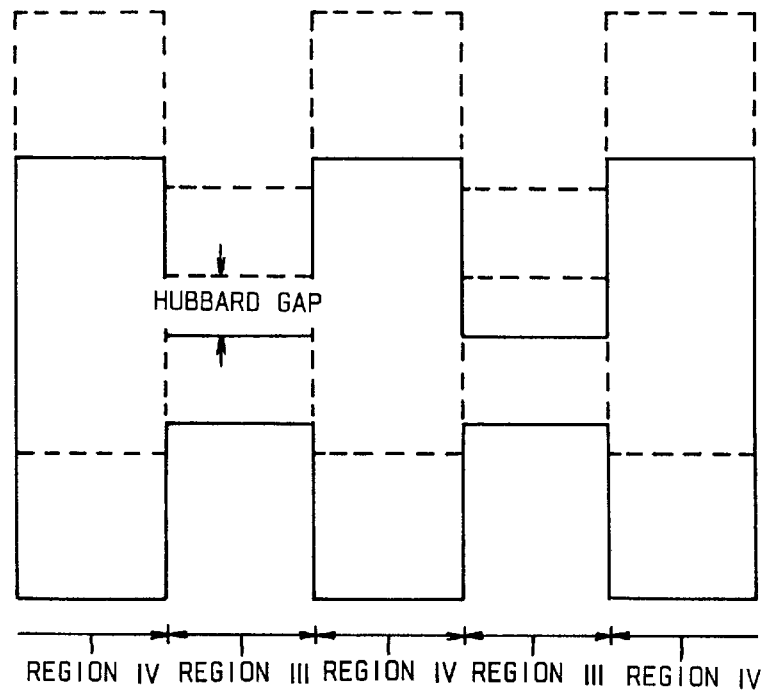
FIG. 34 is an energy band diagram of the quantum device according to the tenth embodiment, with an external electric field applied in the positive direction of the z-axis.

When lowering the potential of the electrode 53 than the potential of the other electrode 54, specifically by connecting the electrode 53 to ground and applying a negative voltage to the electrode 54, to apply a uniform external electric field in the negative direction of the z-axis, electrons in respective tetrahedral quantum dots QD of the quantum dots arrays in the regions III receive a force in the negative direction of the z-axis, and are forced to move to lower portions of the quantum dots QD, i.e. to the vertexes of the tetrahedrons. In other words, distribution of wave functions of electrons in the quantum dots QD is deflected to the negative side of the z-axis. Then the distance between adjacent quantum dots QD increases effectively. As a result, the regions III represent an insulator phase because of a Mott metal-insulator transition due to a Mott-Stark effect, and behave as a tunnelling barrier region. Electrons in respective tetrahedral quantum dots QD forming the quantum dots arrays in the regions IV also receive a force in the negative direction of the z-axis, and are forced to move to lower portions, i.e. to the bottoms of the tetrahedrons. In other words, distribution of wave functions of electrons in the quantum dots QD is deflected to the negative side of the z-axis. Then the effective distance between adjacent quantum dots QD decreases effectively. As a result, the regions IV represent a metal phase because of a Mott metal-insulator transition due to a Mott-Stark effect, and behave as a conductive region. Thus, a superlattice is established by the regions III having an insulator phase and behaving as a tunnelling barrier region and the regions IV having a metal phase and behaving as a conductive region. FIG. 34 is an energy band diagram of the quantum device according to the tenth embodiment when an external electric field is applied in the positive direction of the z-axis as referred to above.

Figure 35:
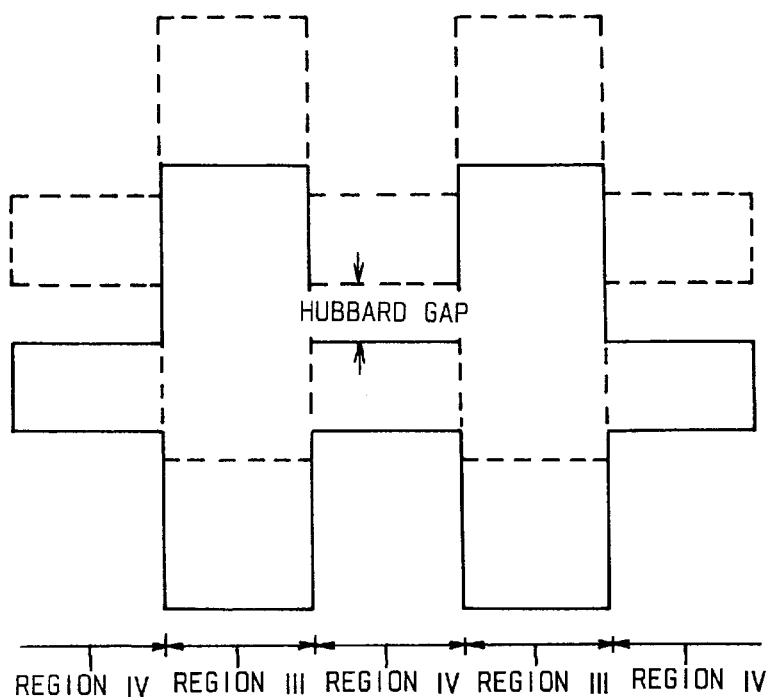
FIG. 35 is an energy band diagram of the quantum device according to the tenth embodiment, with an external electric field applied in the minus direction of the z-axis.

Next, the direction of application of the external electric field is inverted. That is, an external electric field is applied in the negative direction of the z-axis by lowering the potential of the electrode 53 than the potential of the other electrode 54, for example, by connecting the electrode 53 to ground and applying a positive voltage to the electrode 54. As a result, electrons in respective tetrahedral quantum dots QD of the quantum dots arrays in the regions III receive a force in the positive direction of the z-axis, and are forced to move to upper portions of the quantum dots QD, i.e. to the bottoms of the tetrahedrons. In other words, distribution of wave functions of electrons in the quantum dots QD is deflected to the positive side of the z-axis. Then the distance between adjacent quantum dots QD decreases effectively. As a result, the regions III represent a metal phase because of a Mott metal-insulator transition due to a Mott-Stark effect, and behave as a conductive region. Electrons in respective tetrahedral quantum dots QD forming the quantum dots arrays in the regions IV also receive a force in the positive direction of the z-axis, and are forced to move to upper portions, i.e. to the vertexes of the tetrahedrons. In other words, distribution of wave functions of electrons in the quantum dots QD is deflected to the positive side of the z-axis. Then the effective distance between adjacent quantum dots QD increases effectively. As a result, the regions IV represent an insulator phase because of a Mott metal-insulator transition due to a Mott-Stark effect, and behave as a tunnelling barrier region. Thus, a superlattice is established by the regions III having a metal phase and behaving as a conductive region and the regions IV having an insulator phase and behaving as a tunnelling barrier region. FIG. 35 is an energy band diagram of the quantum device according to the tenth embodiment when an external electric field is applied in the negative direction of the z-axis as referred to above.

As described above, when the external electric field is applied in the positive direction of the z-axis, the regions III represent an insulator phase and behave as a tunneling barrier region while the regions IV represent a metal phase and behave as a conductive region; and when the external electric field is applied in the negative direction of the z-axis, the regions III represent a metal phase and behave as a conductive region while the regions IV represent an insulator phase and behave as a tunnelling barrier region. That is, by inverting the direction of application of the external electric field, tunnelling barrier regions and conductive regions can be interchanged between the regions III and IV. This can be summarized as the following table.

| direction of application of electric field | positive direction of z-axis | negative direction of z-axis |
| --- | --- | --- |
| region III | tunneling barrier region | conductive region |
| region IV | conductive region | tunnelling barrier region |

Figure 36A:
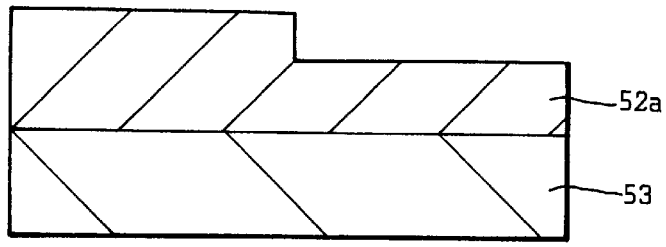
FIGS. 36A to 36D are cross-sectional views for explaining a manufacturing process of the quantum device according to the tenth embodiment.
Figure 36B:
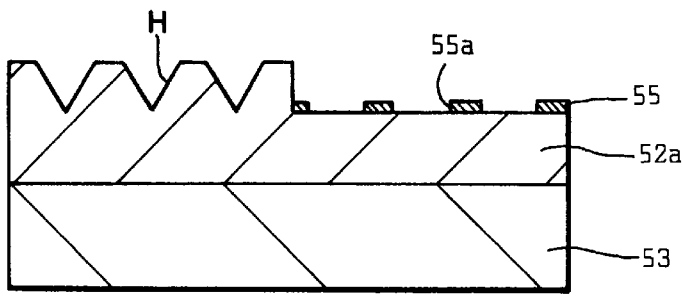
Figure 36C:
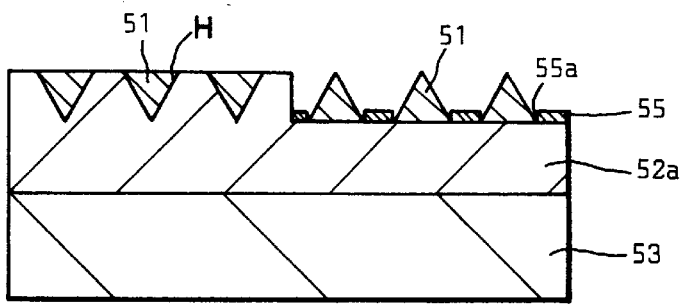
Figure 36D:
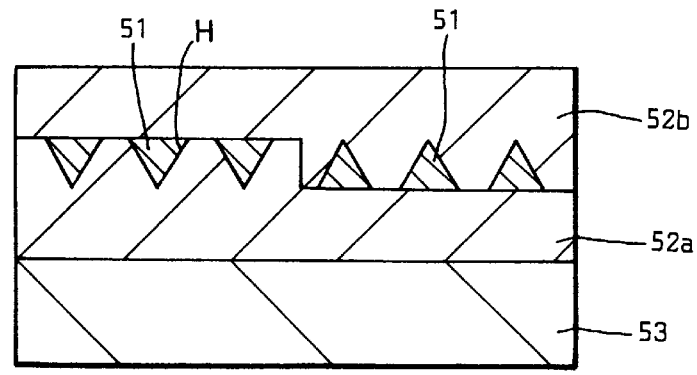

The quantum device according to the tenth embodiment may be fabricated, for example, as follows. First prepared is an n-type GaAs substrate as the electrode 53, as shown in FIG. 36A, and an AlGaAs layer 52a of a predetermined thickness is epitaxially grown on the n-type GaAs substrate as the electrode 53 by, for example, MOCVD. Selective portions of the AlGaAs layer 52a corresponding to the regions IV are subsequently etched off. After that, as shown in FIG. 36B, a SiO$_2$ film 55 having two-dimensional arrays of, regular-triangular openings 55a is formed on selective portions of the AlGaAs layers 52a corresponding to the regions IV while tetrahedral holes H in two dimensional arrays are formed in selective portions of the AlGaAs 52a corresponding to the regions III. After that, GaAs is epitaxially grown on the entire surface by MOCVD again. As a result, as shown in FIG. 36C, GaAs layers 51 in the form of tetrahedrons epitaxially grow on selective portions of the AlGaAs layer 52a in the openings 55a of the $SiO_2$ film 55 in the regions IV, and GaAs layers 51 epitaxially grows in the holes H in the AlGaAs layer 52a in the regions III. After the $SiO_2$ 55 film is subsequently etched off, an AlGaAs layer 52b is epitaxially grown on the entire surface by MOCVD as shown in FIG. 36D. After that, the electrode 54 comprising a metal film, for example, is formed on the AlGaAs layer 52b by, for example, vacuum evaporation. Thus an intended quantum device as shown in FIGS. 32 and 33 is completed.

As described above, the quantum device according to the tenth embodiment uses the alternating, close alignment of regions III each comprising a quantum dots array with an x-y-plane arrangement of tetrahedral quantum dots QD with a geometrical asymmetry in the z-axis direction; and regions IV each comprising a quantum dots array with an x-y-plane arrangement of tetrahedral quantum dots QD having a geometrical asymmetry opposite to that of the quantum dots QD in the regions III so that, with an external electric field in the positive direction of the z-axis, the regions III and IV behave as tunnelling barrier regions and conductive regions, respectively, whereas, with an external electric field in the negative direction of the z-axis, the regions III and IV behave as conductive regions and tunnelling barrier regions, respectively. That is, by inverting the direction of application of the external electric field, tunneling barrier regions and conductive regions can be interchanged between the regions III and IV. In this case, since the device utilizes a many-body quantum-mechanical tunneling effect via the Hubbard gap of the insulator-phase region, it does not require a strict uniformity in fabrication of quantum dots QD, and its fabrication and incorporation into an IC are relatively easy.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the first to fourth embodiments have been explained as using two-dimensional quantum dots arrays with a two-dimensional arrangement of quantum dots, the invention can be applied in the same manner even to devices using one-dimensional or three-dimensional quantum dots array or arrays with a one-dimensional or three-dimensional arrangement of quantum dots.

Similarly, although the fourth, ninth and tenth embodiments have been described as using quantum dots QD having a geometrical asymmetry in the z-axis direction to form quantum dots arrays in channel regions, such quantum dots may be modified to have a compositional asymmetry in the z-axis direction as used in the first embodiment, for example.

In the first embodiment, the mixture ratio x of the i-type $Al_xGa_{1-x}As$ layers 3 as quantum wells of quantum dots QD varies in the z-axis direction; however, an equivalent effect is obtained even by arranging the quantum wells of quantum dots QD as a multi quantum well structure in the z-axis direction, then varying the widths of the quantum wells, and hence varying the effective mass of electrons in the z-axis direction.

Figure 37:
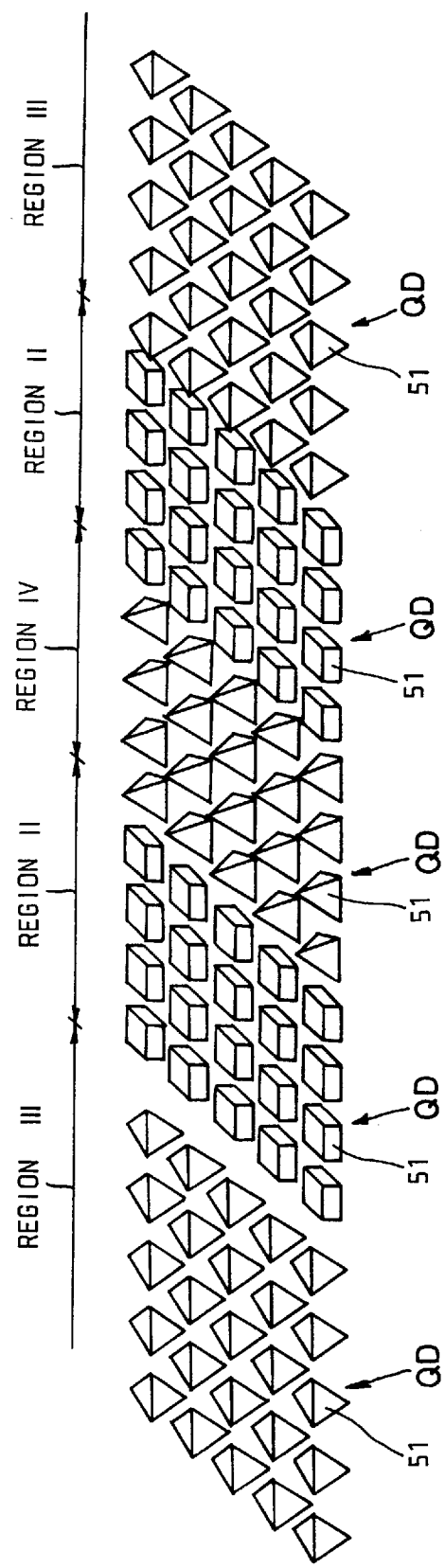
FIG. 37 is a perspective view for explaining a quantum device according to a further embodiment.

It is also possible to make a complex quantum device by incorporating one or more regions II with quantum dots QD symmetric in the z-axis direction as used in the ninth embodiment into the quantum device according to the tenth embodiment using regions III and IV having quantum dots QD with opposite asymmetries in the z axis direction. An example of such construction is shown in FIG. 37.

Note that oxide superconductors (such as YBaCuO) known as representing superconductivity at high temperatures behave as insulators with no holes doped. Although such oxide superconductors should behave as metals considering the valence of their atoms, they actually behave as insulators. It is therefore presumed that Mott transitions caused by strong correlations among electrons change them to insulators. The gap causing such insulative behaviors is the Hubbard gap. Therefore, according to the same principle as that of the present invention, quantum-mechanical tunnelling through a thin film of such an insulator can occur.

What is claimed is:

1. A quantum box structure comprising a plurality of quantum boxes having a side substantially on a common plane, each said quantum box being asymmetric in a direction orthogonal to said plane in a composition of materials constituting said quantum box.

2. The quantum box structure according to claim 1 wherein barrier heights for quantum confinement of said quantum boxes vary in said direction orthogonal to said plane.

3. The quantum box structure according to claim 1 wherein respective said quantum boxes are surrounded by a barrier layer, said quantum boxes and said barrier layer being made by a heterojunction of compound semiconductors.

4. The quantum box structure according to claim 3 wherein barrier heights for quantum confinement of said quantum boxes vary in said direction orthogonal to said plane with changes in mixture ratio of said compound semiconductors.

5. The quantum box structure according to claim 4 wherein said barrier heights vary monotonously in said direction orthogonal to said plane.

6. The quantum box structure according to claim 1 wherein electric conductivity in said quantum boxes is modulated by applying an external electric field in said direction orthogonal to said plane.

7. The quantum box structure according to claim 6 wherein an electrode for applying said external electric field is provided adjacent to said quantum boxes.

8. The quantum box structure according to claim 6 wherein said quantum boxes exhibit an insulator phase.

9. The quantum box structure according to claim 6 wherein said quantum boxes exhibit a metal phase.

* * * * *